(12) United States Patent
Kim et al.

(10) Patent No.: US 12,211,572 B2
(45) Date of Patent: Jan. 28, 2025

(54) SEMICONDUCTOR DEVICE AND MEMORY SYSTEM

(71) Applicant: SAMSUNG ELECTRONICS CO., LTD., Suwon-si (KR)

(72) Inventors: Kyoungho Kim, Hwaseong-si (KR); Chulwoo Kim, Seoul (KR); Hyunsu Park, Seoul (KR); Jincheol Sim, Seoul (KR)

(73) Assignees: Samsung Electronics Co., Ltd. (KR); Korea University Research & Business Foundation (KR)

( * ) Notice: Subject to any disclaimer, the term of this patent is extended or adjusted under 35 U.S.C. 154(b) by 267 days.

(21) Appl. No.: 17/680,425

(22) Filed: Feb. 25, 2022

(65) Prior Publication Data

US 2023/0047923 A1    Feb. 16, 2023

(30) Foreign Application Priority Data

Aug. 10, 2021   (KR) ................. 10-2021-0105193

(51) Int. Cl.
*G11C 29/12* (2006.01)
*G11C 29/56* (2006.01)

(52) U.S. Cl.
CPC .. *G11C 29/12015* (2013.01); *G11C 29/56004* (2013.01); *G11C 29/56012* (2013.01)

(58) Field of Classification Search
CPC ........ G11C 29/12015; G11C 29/56004; G11C 29/56012; G11C 7/1078; G11C 29/023; G11C 7/1093; G11C 7/222; G11C 2207/2254
See application file for complete search history.

(56) References Cited

U.S. PATENT DOCUMENTS 8,324,946 B2 * 12/2012 Becker ................ H03L 7/07
  327/158
10,044,539 B2   8/2018 Wu et al.
10,284,360 B2   5/2019 Choi et al.
(Continued)

FOREIGN PATENT DOCUMENTS

KR    10-2057106 B1   12/2019

OTHER PUBLICATIONS

Soo-Min Lee et al., "A Single-Ended Parallel Transceiver With Four-Bit Four-Wire Four-Level Balanced Coding for the Point-to-Point DRAM Interface," IEEE Journal of Solid-State Circuits, vol. 51, No. 8, Aug. 2016, pp. 1890-1901.

*Primary Examiner* — Mohammed A Bashar
(74) *Attorney, Agent, or Firm* — Fish & Richardson P.C.

(57) ABSTRACT

A semiconductor device includes a multilevel receiver including a signal determiner receiving a plurality of multilevel signals and outputting a result of mutual comparison of the plurality of multilevel signals as an N-bit signal, where N is a natural number equal to or greater than 2. A decoder restores a valid signal among the N-bit signals from the signal determiner to an M-bit data signal, where M is a natural number less than N. A clock generator receives a reference clock signal, generates an input clock signal using the reference clock signal, inputs the input clock signal to the signal determiner, and determines a phase of the input clock signal based on an occurrence probability of an invalid signal not restored to the M-bit data signal among the N-bit signals.

20 Claims, 20 Drawing Sheets

(56) References Cited

U.S. PATENT DOCUMENTS

| | | |
|---|---|---|
| 10,289,600 B2 | 5/2019 | Sejpal et al. |
| 10,848,296 B2 | 11/2020 | Toi |
| 10,855,497 B2 | 12/2020 | Hayashi et al. |
| 10,892,791 B2 | 1/2021 | Hossain et al. |
| 2001/0052808 A1* | 12/2001 | Hamamoto ............ H03K 5/135 327/291 |
| 2004/0155806 A1* | 8/2004 | Lee ................ H03M 1/0624 341/155 |
| 2004/0252800 A1* | 12/2004 | Kota ................ H03L 7/18 375/354 |
| 2018/0278405 A1 | 9/2018 | Yao et al. |
| 2018/0302264 A1 | 10/2018 | Liao et al. |
| 2021/0058280 A1 | 2/2021 | Lee et al. |
| 2021/0091922 A1 | 3/2021 | Kim et al. |

\* cited by examiner

SEMICONDUCTOR DEVICE AND MEMORY SYSTEM

CROSS-REFERENCE TO RELATED APPLICATION(S)

This application claims the benefit under 35 USC 119(a) of Korean Patent Application No. 10-2021-0105193 filed on Aug. 10, 2021 in the Korean Intellectual Property Office, the entire disclosure of which is incorporated herein by reference for all purposes.

BACKGROUND

The present disclosure relates to a semiconductor device and a memory system.

Memory devices may provide a function of writing and erasing data or reading recorded data, in response to control signals received from external controllers. A memory device may receive data from a controller and store the received data in memory cells and may transmit data by a non-return-zero (NRZ) signal and other multilevel signals, to improve the data transfer rate between the memory device and the controller.

SUMMARY

Example embodiments provide a semiconductor device and a memory system in which information transmitted as a multilevel signal by a controller may be accurately restored by adjusting a phase of a clock signal provided to a receiver using a signal generated in a process of restoring a plurality of multilevel signals received from the controller to a data signal.

According to example embodiments, a semiconductor device includes a multilevel receiver including: (1) a signal determiner receiving a plurality of multilevel signals and outputting a result of mutual comparison of the plurality of multilevel signals as an N-bit signal, where N is a natural number equal to or greater than 2, and (2) a decoder restoring a valid signal among the N-bit signals from the signal determiner to an M-bit data signal, where M is a natural number less than N. A clock generator receives a reference clock signal, generates an input clock signal using the reference clock signal, inputs the input clock signal to the signal determiner, and determines a phase of the input clock signal based on an occurrence probability of an invalid signal not restored to the M-bit data signal among the N-bit signals.

According to example embodiments, a semiconductor device includes a first multilevel receiver and a second multilevel receiver receiving a plurality of multilevel signals and restoring a valid signal mapped to a data signal among sampling result signals of the plurality of multilevel signals to the data signal. A clock generator receives a reference clock signal, generates an input clock signal and an inverted input clock signal using the reference clock signal, inputs the input clock signal to the first multilevel receiver, inputs the inverted input clock signal to the second multilevel receiver, and determines a phase of the input clock signal based on an occurrence probability of an invalid signal not mapped to a data signal among the sampling result signals.

According to example embodiments, a memory system includes a memory device including a plurality of memory cells. A controller is connected to the memory device through a plurality of data pins and a clock pin and controls the memory device. The controller converts a data signal into a plurality of multilevel signals, provides the plurality of multilevel signals to the memory device through the plurality of data pins, and provides a reference clock signal to the memory device through the clock pin. The memory device receives the plurality of multilevel signals, is synchronized with an input clock signal generated using the reference clock signal and outputs a sampling result signal of the plurality of multilevel signals, and determines a phase of the input clock signal based on an occurrence probability of an invalid signal not mapped to a data signal among the sampling result signals.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments will be described with reference to the accompanying drawings.

Figure 1:
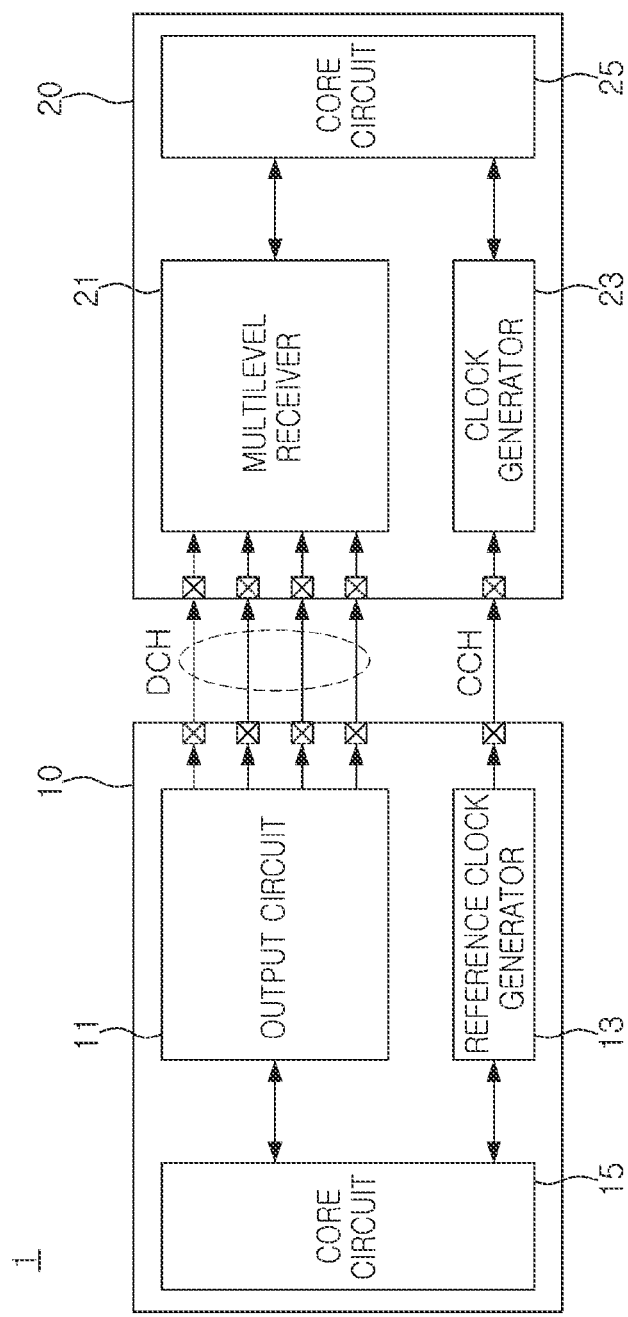
FIG. 1 is a diagram schematically illustrating a system including a semiconductor device according to an example embodiment.

FIG. 1 is a diagram schematically illustrating a system including a semiconductor device according to an example embodiment.

Referring to FIG. 1, a system 1 according to an example embodiment may include a first semiconductor device 10 and a second semiconductor device 20 for exchanging data. In the system 1, the first semiconductor device 10 may transmit data to the second semiconductor device 20. For example, the first semiconductor device 10 may transmit a data signal and a clock signal to the second semiconductor device 20.

The first semiconductor device 10 may include an output circuit 11, a reference clock generator 13, and a core circuit 15. The output circuit 11 transmits a data signal to the second semiconductor device 20, the reference clock generator 13 transmits a clock signal to the second semiconductor device 20, and the core circuit 15 may control the overall operation of the first semiconductor device 10.

The second semiconductor device 20 may include a multilevel receiver 21, a clock generator 23, and a core circuit 25. The multilevel receiver 21 receives a data signal from the first semiconductor device 10, and the clock generator 23 provides a clock signal to the multilevel receiver 21, using the clock signal received from the first semiconductor device 10. The core circuit 25 may control the overall operation of the second semiconductor device 20.

The output circuit 11 may convert M-bit data into a plurality of multilevel signals and transmit the plurality of multilevel signals through a data channel DCH including a plurality of pins. The plurality of multilevel signals may have non-overlapping levels among levels of a number greater than two.

The reference clock generator 13 may generate a reference clock signal and transmit the reference clock signal to the second semiconductor device 20 through a clock channel CCH. The reference clock signal may be a signal that repeats increasing and decreasing between two levels. However, according to example embodiments, the reference clock signal may also be generated as a multilevel signal similar to the data signal and transmitted to the second semiconductor device 20. The number of levels that the reference clock signal may have and the number of levels that the data signal may have may be the same as or different from each other.

The multilevel receiver 21 may restore a plurality of multilevel signals received from the output circuit 11 into a data signal. For example, the multilevel receiver 21 may include N comparators that output a result of mutual comparison of a plurality of multilevel signals received from the output circuit 11, as N-bit signals, and a decoder that restores the N-bit signals into M-bit signals. N may be a natural number greater than M.

Each of the N comparators included in the multilevel receiver 21 may compare the levels of any two signals among a plurality of multilevel signals received through the data channel DCH and may output the result to the decoder. An operation timing of each of the comparators may be determined according to a clock signal transmitted from the clock generator 23 to the multilevel receiver 21. For example, each of the comparators may mutually compare the two signals, at a rising edge and a falling edge of the clock signal and output the result to the decoder. If the phase of the clock signal is not properly controlled, an error may occur in the output of the comparators and data restored by the multilevel receiver 21.

According to an example embodiment, the clock generator 23 may use the N-bit signals output from the multilevel receiver 21 to determine the phase of the clock signal in which the probability of an error occurring in the output of the comparators may be significantly reduced. When the probability that an error occurs in the output of the comparators is significantly reduced, the performance of the multilevel receiver 21 may be improved.

Figure 2:
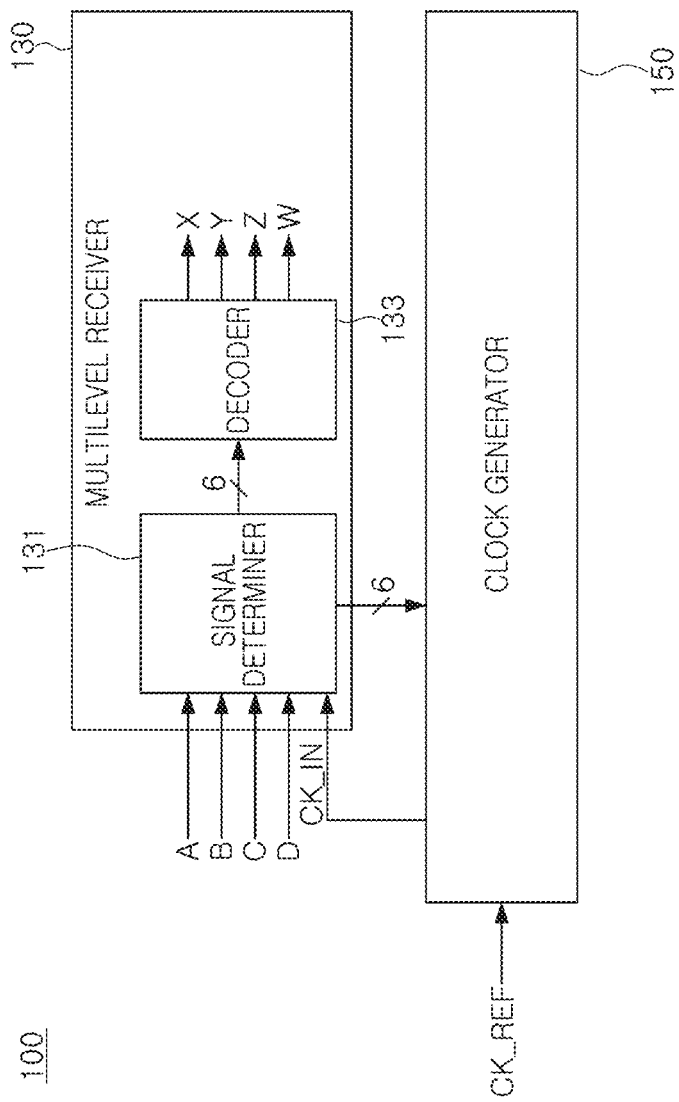
FIG. 2 is a schematic diagram illustrating a semiconductor device according to an example embodiment.

FIG. 2 is a schematic diagram illustrating a semiconductor device according to an example embodiment.

Referring to FIG. 2, a semiconductor device 100 according to an example embodiment may include a multilevel receiver 130 and a clock generator 150. The multilevel receiver 130 may receive a plurality of multilevel signals and restore the data signals, and the clock generator 150 may provide a clock signal to the multilevel receiver 130.

The multilevel receiver 130 may receive a plurality of multilevel signals A-D. On the other hand, the semiconductor device 100 may further include an analog front end (AFE) for amplifying multilevel signals received from a plurality of pins and transmitting the amplified multilevel signals to the multilevel receiver 130.

The multilevel receiver 130 may include a signal determiner 131 and a decoder 133. The signal determiner 131 may generate an N-bit signal by comparing the plurality of multilevel signals A-D with each other, and the decoder 133 may restore the N-bit signal to an M-bit data signal.

The signal determiner 131 may include N comparators generating an N-bit signal. The N comparators may compare the levels of two different signals among the multilevel signals A-D. For example, the signal determiner 131 may include $_4C_2=6$ comparators to mutually compare the 4 multilevel signals A-D, and the six (6) comparators may generate a 6-bit signal by comparing the multilevel signals A-D to each other. The decoder 133 may output a 4-bit data signal (X-W) corresponding to the 6-bit signal generated by the signal determiner 131. The multilevel receiver 130 may restore data according to a result of mutual comparison of the plurality of multilevel signals A-D and, thus, does not need to receive externally a separate reference voltage for determining the magnitude of the multilevel signals A-D.

The clock generator 150 may receive a reference clock signal CK_REF. The clock generator 150 may generate an input clock signal CK_IN by using the reference clock signal CK_REF. The input clock signal CK_IN may be input to the signal determiner 131. Each of the N comparators included in the signal determiner 131 may be synchronized with the input clock signal CK_IN to generate an output.

The clock generator 150 may control the phase of the input clock signal CK_IN supplied to the N comparators such that the multilevel receiver 130 may accurately restore data using the N-bit signal. The multilevel receiver 130 may provide information to the clock generator 150 such that the clock generator 150 may determine the phase of the input clock signal CK_IN.

If the multilevel receiver 130 needs to generate additional information for determining the phase of the input clock signal CK_IN in addition to the N-bit signals generated to restore data, power consumption of the semiconductor device 100 may increase. For example, if the multilevel receiver 130 performs oversampling to detect the edge of the clock signal or generates information using a separate reference voltage, additional power may be consumed in the multilevel receiver 130.

According to an example embodiment of the present disclosure, the clock generator 150 determines an error rate according to the phase of the clock signal, using the N-bit signals output from the signal determiner 131, and may determine a clock phase at which the error rate is minimized as the phase of the input clock signal CK_IN. The clock generator 150 may also determine the phase of the input clock signal CK_IN using information generated to restore data without performing oversampling or using a separate reference voltage. Accordingly, the performance of the multilevel receiver 130 may be improved and power consumption of the semiconductor device 100 may be suppressed.

Figure 3:
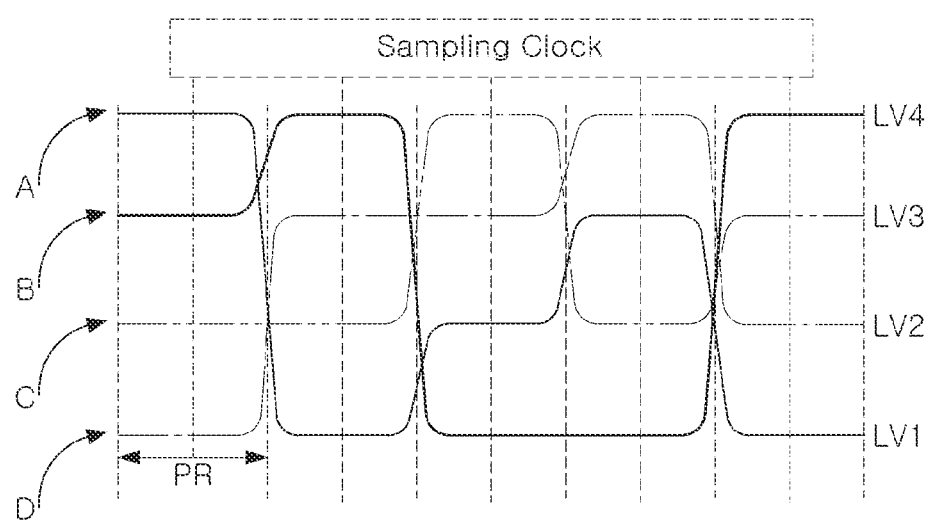
FIGS. 3 to 5 are diagrams illustrating a multilevel signal received by a semiconductor device according to an example embodiment.
Figure 4:
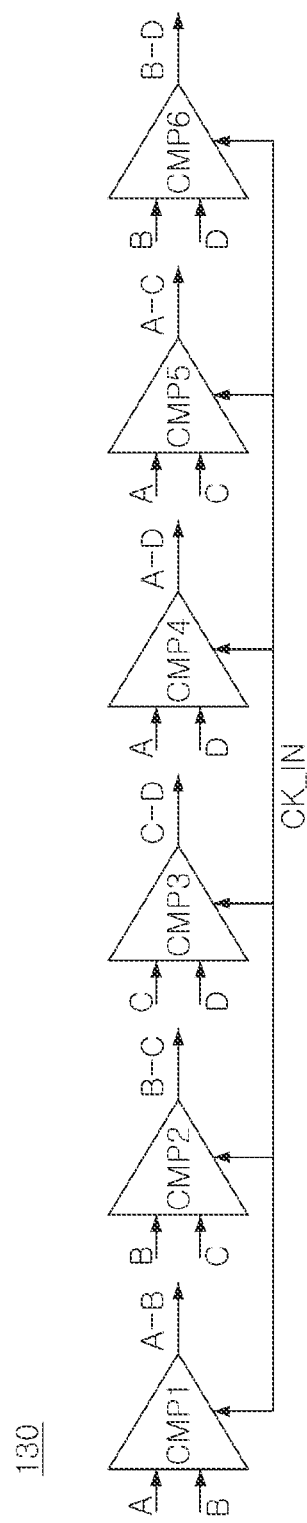
Figure 5:

FIGS. 3 to 5 are diagrams illustrating a multilevel signal received by a semiconductor device according to an example embodiment.

Referring to FIG. 3 first, the semiconductor device may receive four multilevel signals A-D having four levels LV1-LV4. For example, four levels may be generated based on a 4 bit-4 wire-4 level signaling method. According to the 4 bit-4 wire-4 level signaling method, the four multilevel signals A-D having non-overlapping levels among the four levels LV1-LV4 may be generated such that a 4-bit signal may be transmitted in one data transmission period (PR).

The semiconductor device may include a multilevel receiver that receives a plurality of multilevel signals A-D and restores data, and the multilevel receiver may include a plurality of comparators.

Referring to FIG. 4, when the multilevel receiver receives a signal generated based on the 4 bit-4 wire-4 level signaling method, the multilevel receiver may include six comparators CMP1-CMP6. The comparators CMP1-CMP6 may be synchronized with the input clock signal CK_IN and may output a result of comparing the levels of two different signals among the four multilevel signals A-D.

For example, first comparator CMP1 may output a result signal (A-B) by comparing the multilevel signals A and B at the rising edge and the falling edge of the input clock signal CK_IN. The first comparator CMP1 may output a logic '1' when the multilevel signal A is greater than the multilevel signal B, and output a logic '0' when the multilevel signal A is less than the multilevel signal B. Similarly, the second comparator CMP2 may output a result signal (B-C) by comparing the multilevel signals B and C, the third comparator CMP3 may output a result signal (C-D) by comparing the multilevel signals C and D, the fourth comparator CMP4 may output a result signal (A-D) by comparing the multilevel signals A and D, the fifth comparator CMP5 may output a result signal (A-C) by comparing the multilevel signals A and C, and the sixth comparator CMP6 may output a result signal (B-D) by comparing the multilevel signals B and D.

The multilevel receiver may include a decoder restoring a data signal based on a result of mutual comparison of the multilevel signals.

In the example of FIG. 5, the decoder may restore a 4-bit signal by generating four data signals X-W based on the result of mutual comparison of the multilevel signals A-D. As described with reference to FIG. 3, the four multilevel signals A to D may have non-overlapping levels among the four levels in one data transmission period PR. The number of cases in which the four multilevel signals A-D may have non-overlapping levels is 4!=24 types.

If the four multilevel signals A-D may have 24 types of cases, the 6-bit signal generated as a result of the mutual comparison of the multilevel signals A-D may also have 24 types of cases. Among the 24 types of mutual comparison result signals, 16 predetermined signals may be mapped to a 4-bit data signal. FIG. 5 illustrates a mapping relationship between 16 signals among 24 signals and 4 data signals (X-W). For example, when receiving the 6-bit signal '111111' from the signal determiner, the decoder may restore the signal to the 4-bit data signal (X-W) '1111'. As another example, when receiving the 6-bit signal '100111' from the signal determiner, the decoder may restore the signal to the 4-bit data signal (X-W) '1001'.

In a case in which the edge of the input clock signal CK_IN is located in the transition period of the multilevel signals A-D, sampling may occur in the transition period. When sampling occurs in the transition period, a probability that an error occurs in signals output from the comparators may increase. For example, among the 6-bit signals from the comparators, the probability of occurrence of signals not mapped to the 4-bit data signal may increase. Hereinafter, among signals that may be generated from the comparators, a signal mapped to a data signal may be referred to as a valid signal and a signal not mapped to the data signal may be referred to as an invalid signal.

According to an example embodiment of the present disclosure, the clock generator may determine the phase of the input clock signal CK_IN such that the probability that an invalid signal is generated from the multilevel receiver may be significantly reduced. In detail, the clock generator determines the invalid signal generation probability according to the phase of the input clock signal CK_IN by determining whether the output of the multilevel receiver is an invalid signal that does not correspond to $2^M$ signals determined as the output of the multilevel receiver and may determine the phase in which the invalid signal generation probability is minimized, as the phase of the input clock signal CK_IN.

Figure 6:
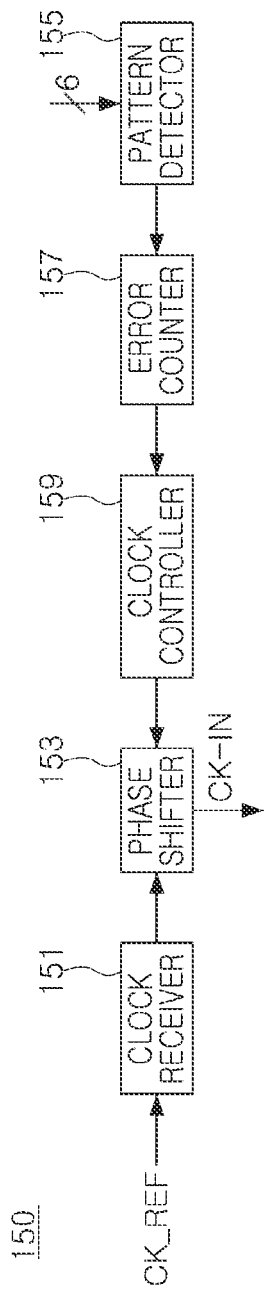
FIG. 6 is a view illustrating a clock generator according to an example embodiment.

FIG. 6 is a view illustrating the clock generator 150 according to an example embodiment. The clock generator 150 illustrated in FIG. 6 may correspond to the clock generator 150 described with reference to FIG. 2.

The clock generator 150 may include a clock receiver 151, a phase shifter 153, a pattern detector 155, an error counter 157, and a clock controller 159. The clock receiver 151 may receive the reference clock signal CK_REF from an external source. The phase shifter 153 may generate a phase-shifted input clock signal CK_IN by using the received reference clock signal CK_REF and may output the generated input clock signal CK_IN externally. The clock controller 159 may determine the phase of the input clock signal CK_IN and may control the phase shifter 153 to generate the phase-shifted input clock signal CK_IN.

The clock controller 159 may determine the phase of the input clock signal CK_IN by which a ratio of an invalid signal among outputs generated from the multilevel receiver may be minimized. The pattern detector 155 may determine whether outputs generated from the multilevel receiver are valid signals or invalid signals. The error counter 157 may count the number of times that outputs generated from the multilevel receiver are determined to be invalid signals, as the number of errors.

The clock controller 159 may control the phase shifter 153 to sequentially output test clock signals having various phases, as the input clock signals CK_IN. The clock controller 159 may determine an invalid signal generation probability according to the phase of the test clock signal, based on the number of errors from the error counter 157 and may determine a phase in which the invalid signal generation probability may be minimized, as the phase of the input clock signal CK_IN.

FIGS. 7 to 12 are diagrams illustrating an operation of a semiconductor device according to an example embodiment.

Figure 7:
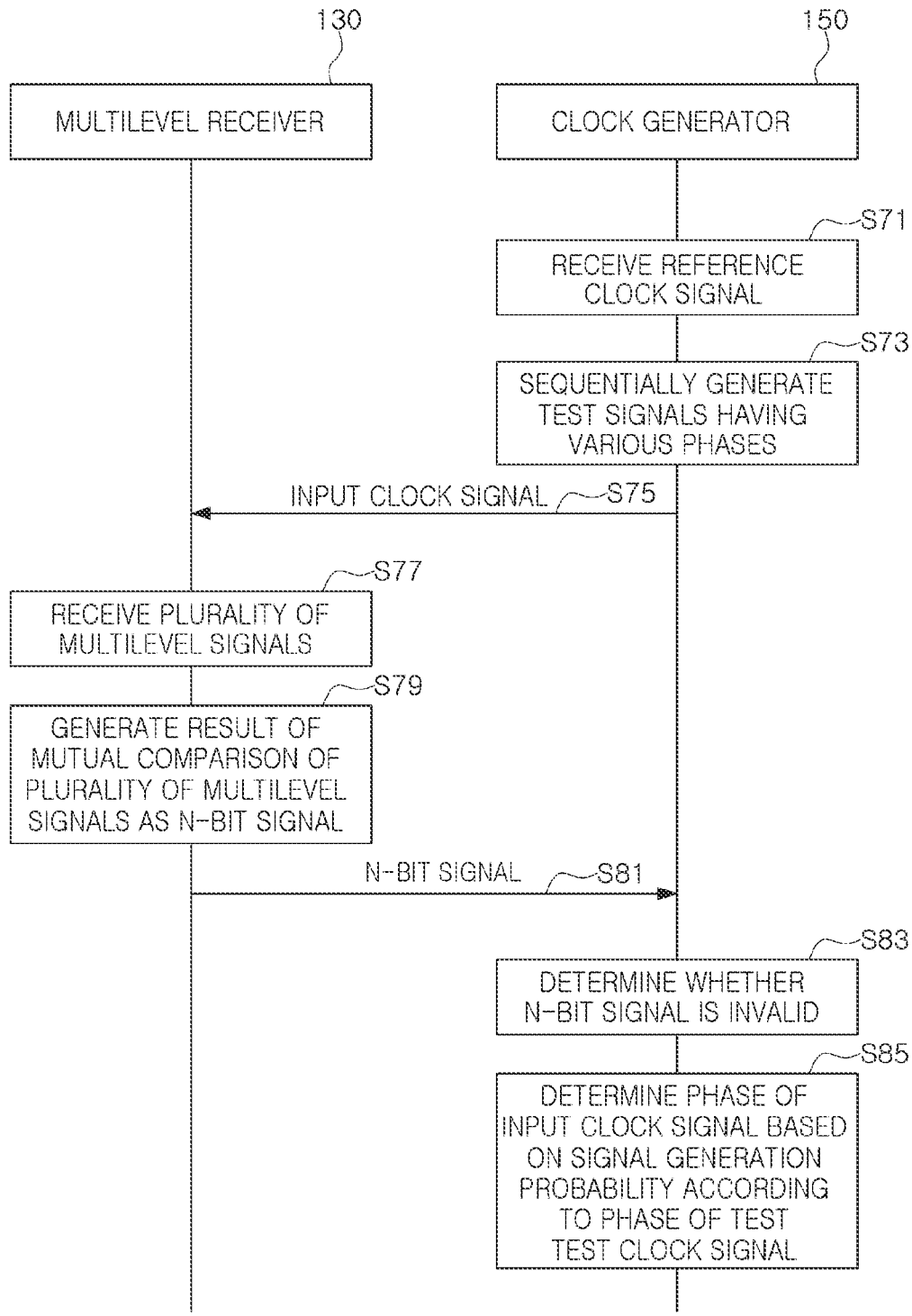
FIGS. 7 to 12 are diagrams illustrating an operation of a semiconductor device according to an example embodiment.

Referring to FIG. 7, a semiconductor device according to an example embodiment may include a multilevel receiver 130 and a clock generator 150. The multilevel receiver 130 and the clock generator 150 may correspond to the multilevel receiver 130 and the clock generator 150 described with reference to FIG. 2.

The operation of the semiconductor device according to the example embodiment may be started by receiving the reference clock signal CK_REF from the external device (in operation S71). For example, the clock generator 150 may receive the reference clock signal CK_REF from another semiconductor device connected to communicate with each other.

In operation S73, the clock generator 150 may sequentially generate test clock signals having various phases using the reference clock signal CK_REF. In detail, the clock generator 150 may sequentially generate the respective test clock signals for a predetermined period of time.

In operation S75, the clock generator 150 may provide the sequentially generated test clock signals to the multilevel receiver 130, as the input clock signals CK_IN.

In operation S77, the multilevel receiver 130 may receive a plurality of multilevel signals from an external device. For example, the plurality of multilevel signals may be signals generated by converting a test data sequence, for example, a pseudo random binary sequence (PRBS).

In operation S79, the multilevel receiver 130 may be synchronized with the input clock signal CK_IN to compare the plurality of multilevel signals with each other and may generate an N-bit signal as a result of the mutual comparison of the plurality of multilevel signals. The multilevel receiver 130 may restore the generated N-bit signal to an M-bit data signal.

In operation S81, the multilevel receiver 130 may transmit the N-bit signal to the clock generator 150.

In operation S83, the clock generator 150 may determine whether the N-bit signal is an invalid signal. The clock generator 150 may include a pattern detector 155 that outputs an error signal when the N-bit signal is an invalid signal that is not mapped to the M-bit data signal.

Figure 8:
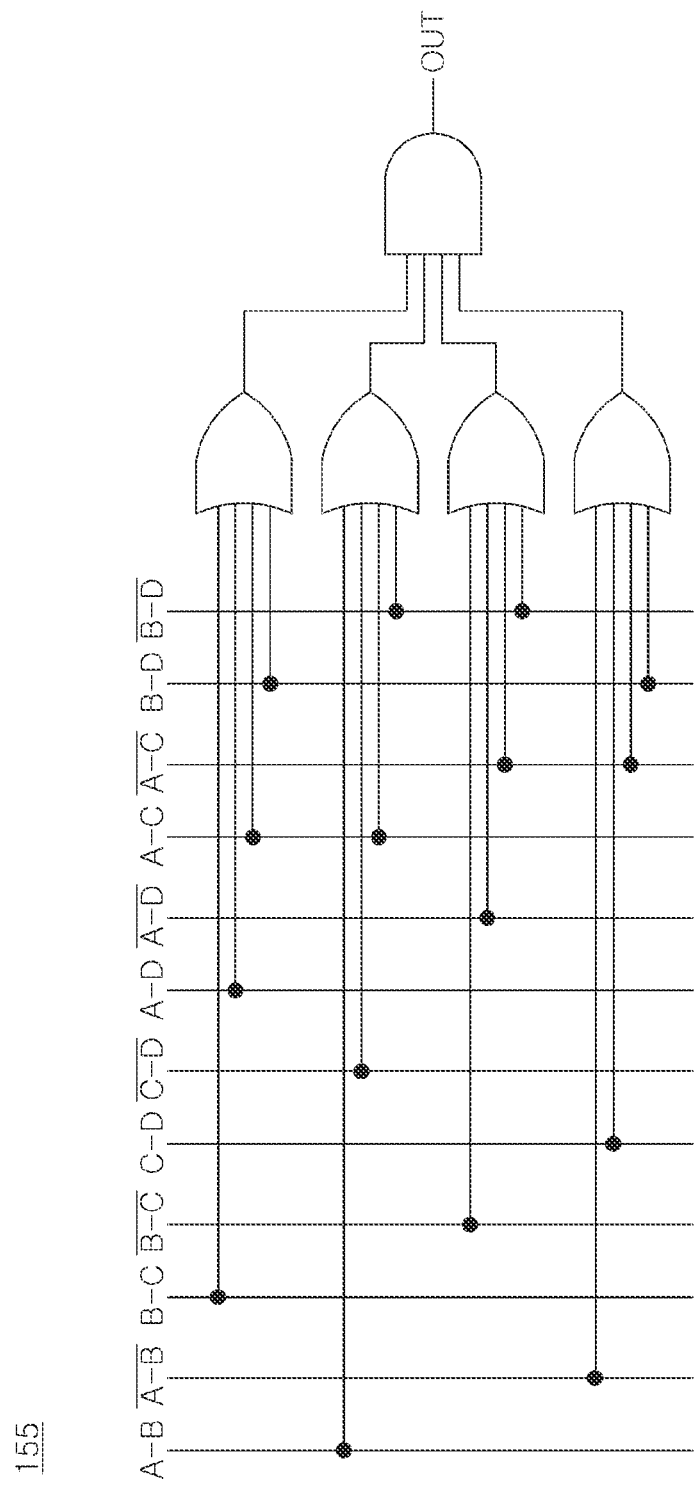

FIG. 8 illustrates an example of the pattern detector 155.

The pattern detector 155 may be implemented as a logic circuit including a plurality of logic gates. Referring to FIG. 8, a signal of 6 bits of (A-B), (B-C), (C-D), (A-D), (A-C) and (B-D), corresponding to the mutual comparison result of four multilevel signals, may be input to the pattern detector 155. The pattern detector 155 may output an output signal OUT according to a logic operation result of the 6-bit signal.

For example, the pattern detector 155 may output a logic '0' as an output signal OUT when the input 6-bit signal is a valid signal mapped to the 4-bit data signal and may output a logic '1' as the output signal OUT when the input 6-bit signal is an invalid signal that is not mapped to the 4 bit data signal. In the error counter 157 described with reference to FIG. 6, the number of times a logic '1' occurs as the output signal OUT may be counted. An example of a valid signal is illustrated in FIG. 5. On the other hand, the logic circuit of the pattern detector 155 illustrated in FIG. 8 is only an example and the configuration of the logic circuit may vary depending on which 16 signals among 6-bit signals are used as valid signals.

Referring back to FIG. 7, in operation S85, the clock generator 150 may determine the phase of the input clock signal CK_IN based on the generation probability of the invalid signal according to the phase of the test clock signal. For example, the clock generator 150 may determine the generation probability of the invalid signal according to the phase of the test clock signal by counting the number of times of generation of the invalid signal for each test clock signal having various phases. The clock generator 150 may determine the phase of the input clock signal CK_IN using two or more clock phases having a lowest probability of generating an invalid signal.

According to an example embodiment of the present disclosure, the clock generator 150 generates test clock signals having various phases and may determine the phase of the input clock signal CK_IN based on the generation probability of the invalid signal according to the phase of the test clock signal. The clock generator 150 may improve the performance of the multilevel receiver 130, by providing the input clock signal CK_IN with which the error occurrence probability of the multilevel receiver 130 may be minimized, to the multilevel receiver 130.

On the other hand, according to an example embodiment, the clock generator 150 performs a coarse determination operation for roughly adjusting the phase of the input clock signal CK_IN and a fine determination operation for finely adjusting the input clock signal CK_IN, thereby determining the phase of the input clock signal CK_IN. Hereinafter, an example embodiment will be described in more detail with reference to FIGS. 9 to 12.

Figure 9:
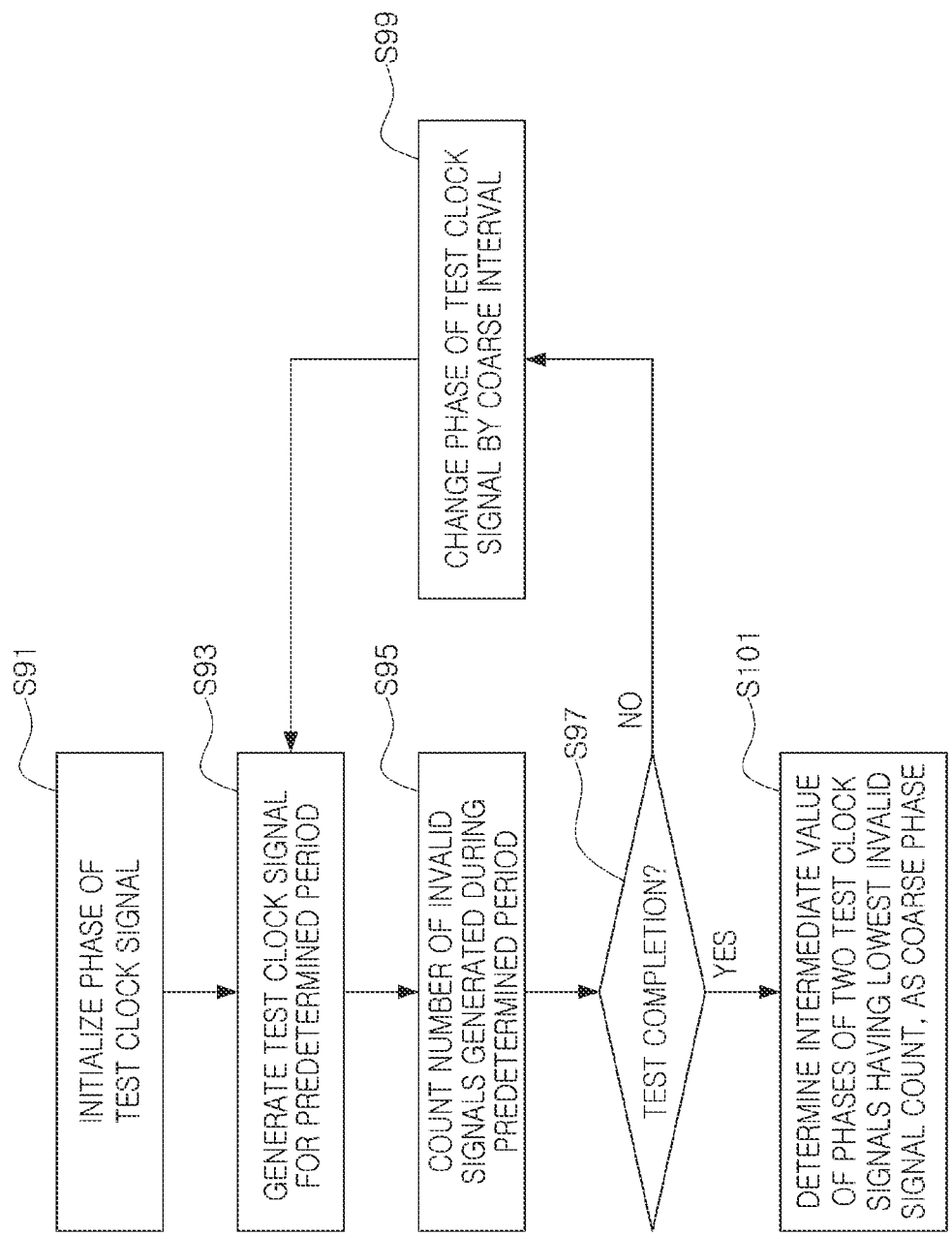
Figure 10:
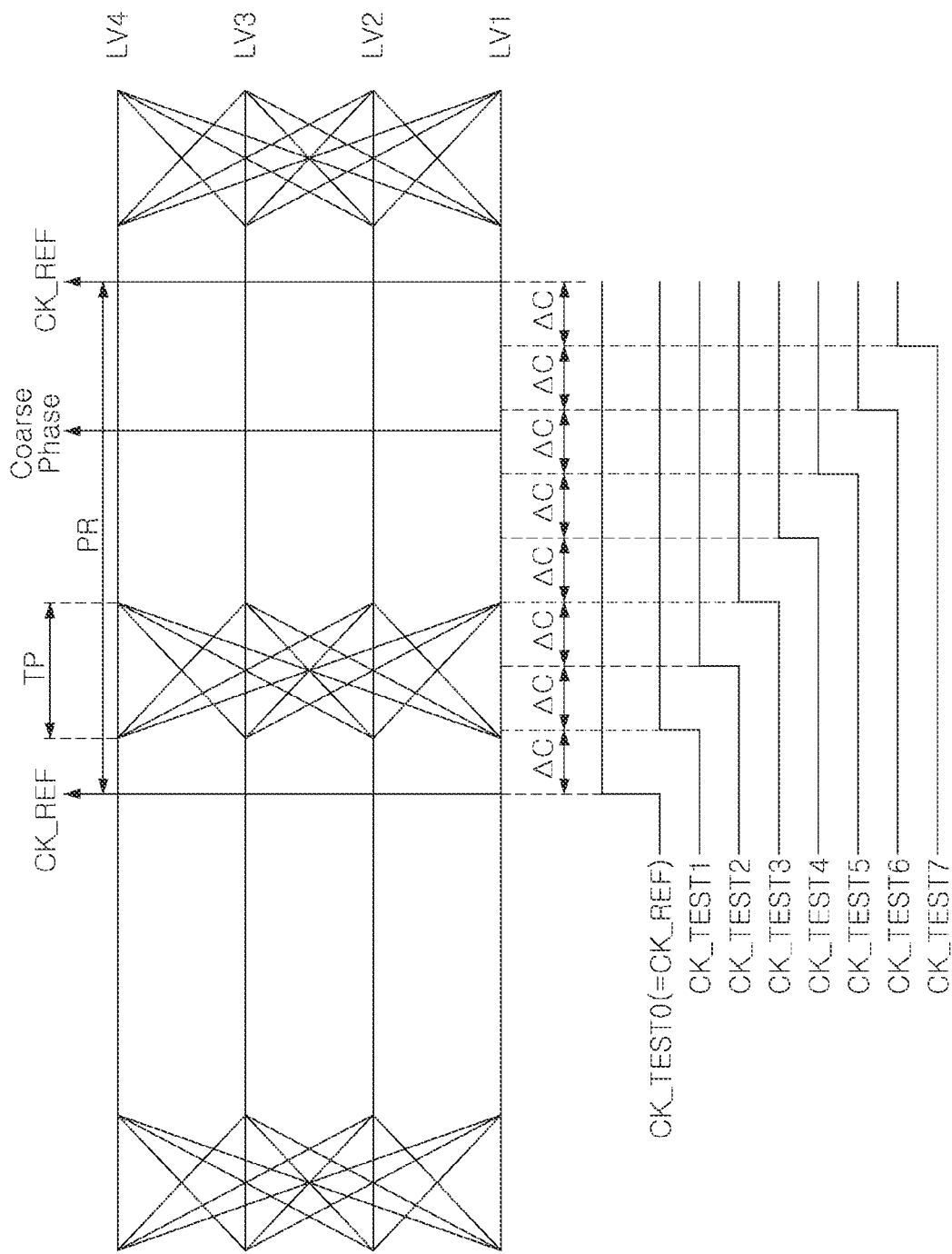

FIGS. 9 to 10 are diagrams illustrating a coarse determination operation according to an example embodiment.

Referring to FIG. 9, the coarse determination operation may start from initializing the phase of the test clock signal (operation S91). For example, the clock generator 150 may initialize the phase of the test clock signal to the same phase as the reference clock signal CK_REF.

In operation S93, the clock generator 150 may generate a test clock signal for a predetermined period. For example, the clock generator 150 may generate the test clock signal during a plurality of data transmission periods to obtain a plurality of N-bit signals generated in synchronization with the test clock signal.

In operation S95, the clock generator 150 may count the number of invalid signals among the N-bit signals generated in synchronization with the test clock signal during the predetermined period. For example, when the phase of the test clock signal is located in the transition period, the number of occurrences of the invalid signal in a predetermined period may be greater than in the case where the phase of the test clock signal is not located therein.

In operation S97, the clock generator 150 may determine whether a test is completed for a predetermined number of test clock signals. For example, the clock generator 150 may perform tests on various phases included in one data transmission period while changing the phase of the test clock signal by a predetermined interval.

In the case in which the test is not completed for the predetermined number of test clock signals (No in operation S97), the clock generator 150 may change the phase of the test clock signal by a coarse interval, for example, 45° in operation S99. Then, the clock generator 150 may repeat operations S93 to S97 with respect to the test clock signal having the changed phase.

In the case in which the test for a predetermined number of test clock signals is completed (YES in operation S97), the clock generator 150 may determine a coarse phase of the input clock signal CK_IN, based on the invalid signal count of the test clock signals, in operation S101. For example, when the intermediate value of the phases of the test clock signal having a lowest invalid signal count is determined as the coarse phase, the position of the edge of the input clock signal CK_IN in the transition period may be avoided.

Referring to FIG. 10, according to an example embodiment, a plurality of multilevel signals received by a semiconductor device may have four levels LV1-LV4 that do not overlap each other. The plurality of multilevel signals may be generated based on a multi-pin multilevel signaling method, for example, a 4 bit-4 wire-4 level signaling method. The semiconductor device may receive 4-bit data during one data transmission period PR by the plurality of multilevel signals generated based on the 4 bit-4 wire-4 level signaling method.

The plurality of multilevel signals may be sampled at a rising edge and a falling edge of the input clock signal CK_IN. The positions of edges of the reference clock signal CK_REF are illustrated in the eye diagram of FIG. 10. The generation period of the edge of the reference clock signal CK_REF may be the same as the data transmission period PR.

During the coarse determination operation, a test may be performed on test clock signals having various phases within one data transmission period PR. In the example of FIG. 10, the data transmission period PR may be divided into eight equal time intervals. Each time interval may be referred to as a coarse interval ($\Delta C$). A plurality of test clock signals CK_TEST0 to CK_TEST7 in which the phase of the reference clock signal CK_REF is shifted by the coarse interval $\Delta C$ may be generated. FIG. 10 illustrates the position of the rising edge according to the phase of the test clock signal.

In the example of FIG. 10, rising edges of the second and third test clock signals CK_TEST2 and CK_TEST3 may be located in the transition period TP. In the case in which the rising edge of the test clock signal is located in the transition period TP, an error may occur in the N-bit signal sampled at the rising edge of the test clock signal and a relatively large number of invalid signals may occur during a predetermined period. On the other hand, when the rising edge of the test clock signal is not located in the transition period TP, a relatively small number of invalid signals may be generated during a predetermined period.

The clock generator 150 may determine an intermediate value of the phases of two test clock signals having a smallest number of occurrences of the invalid signal in a predetermined period, as the coarse phase. For example, when the sixth and seventh test clock signals CK_TEST6 and CK_TEST7 are input to the multilevel receiver 130, it may be determined that the generation probability of the invalid signal is the lowest. The clock generator 150 may determine an intermediate value of the phases of the sixth and seventh test clock signals CK_TEST6 and CK_TEST7, as a coarse phase.

On the other hand, as in a case in which no invalid signal is generated from three or more test clock signals, three or more test clock signals may have the lowest invalid signal generation probability. According to an example embodiment of the present disclosure, the clock generator 150 may determine an intermediate value between the highest phase and the lowest phase among the phases of three or more test clock signals, as the coarse phase.

After the coarse phase is determined, the clock generator 150 may perform a test on a plurality of test clock signals of which phases are advanced or delayed by a predetermined interval, with respect to the clock signal delayed by the coarse phase from the reference clock signal CK_REF and may perform a fine determination operation for determining a fine phase according to the test execution result.

Figure 11:
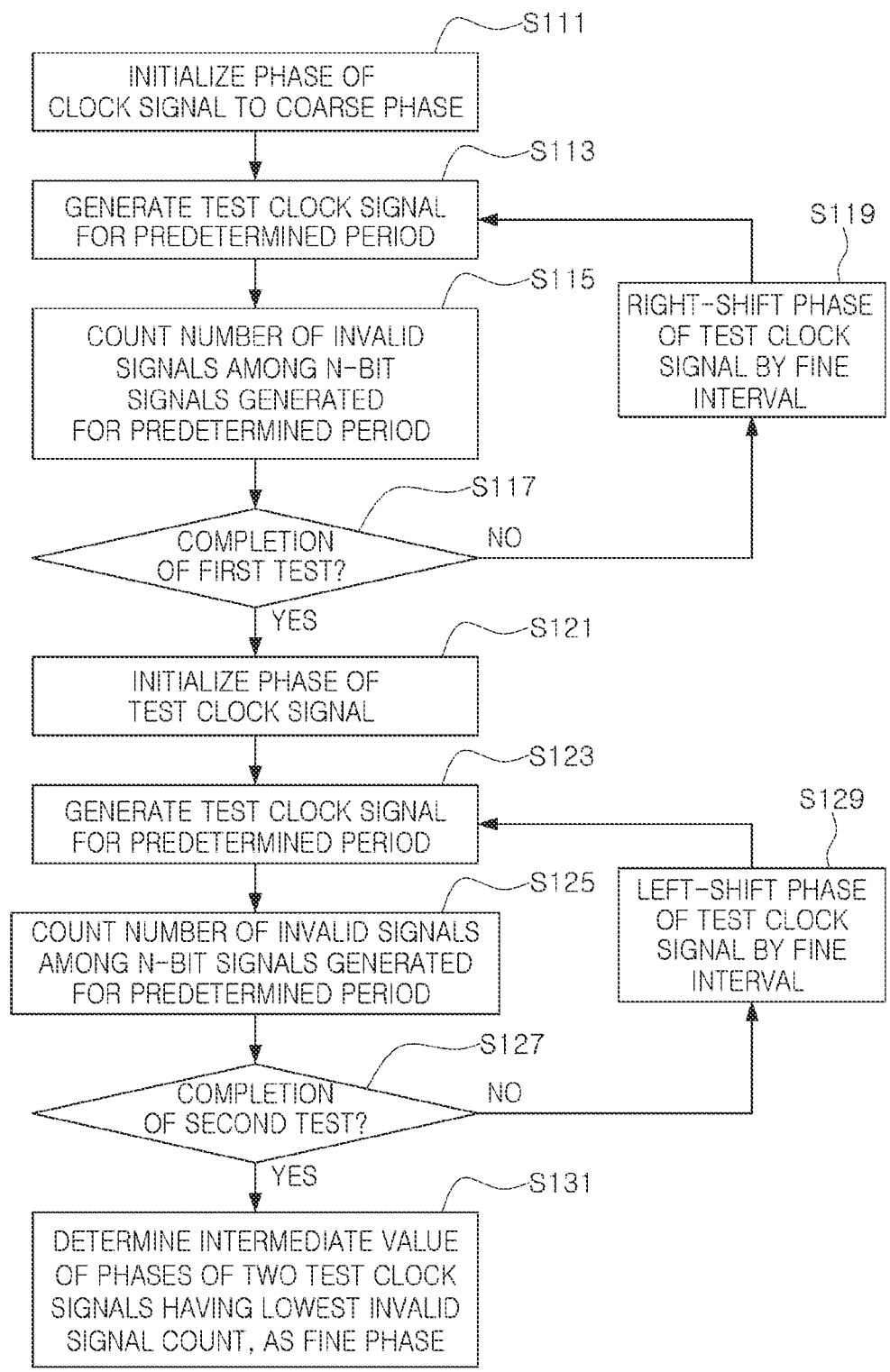
Figure 12:
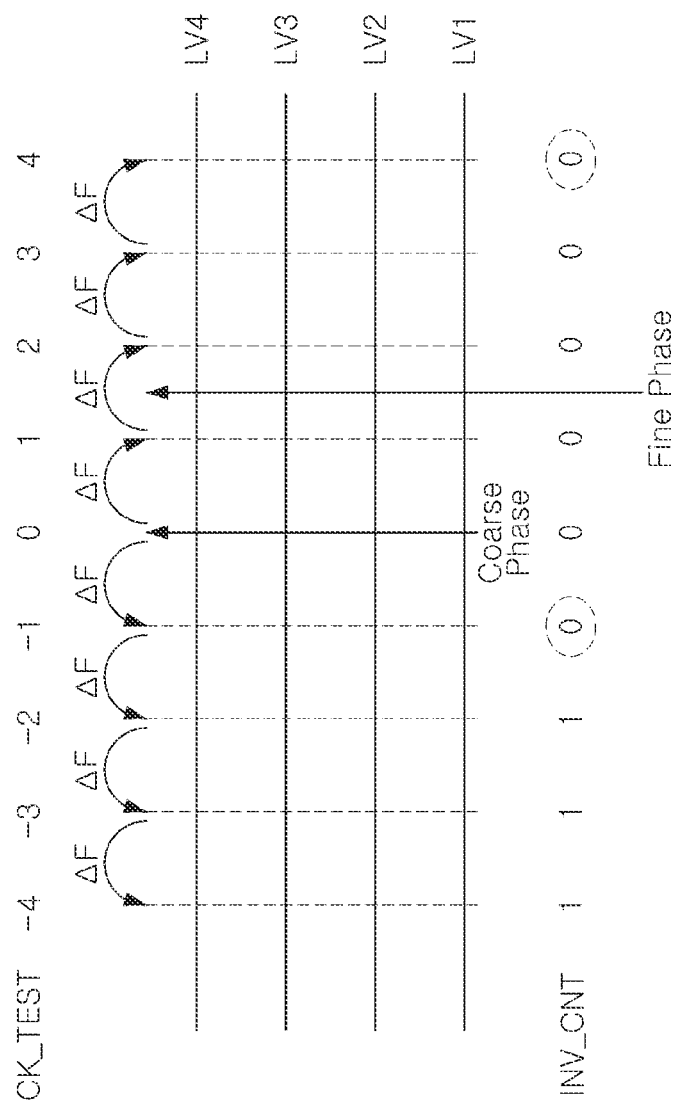

FIGS. 11 to 12 are diagrams illustrating a fine determination operation according to an example embodiment.

According to an example embodiment, the clock generator 150 may perform a first test of right-shifting the phase of the test clock signal by a fine interval to determine the fine phase and of counting the invalid signal generation probability and a second test of counting the invalid signal generation probability while left-shifting the phase of the test clock signal by a fine interval.

Referring to FIG. 11, the fine determination operation may be started by initializing the phase of the test clock signal (in operation S111). For example, the clock generator 150 may initialize the phase of the test clock signal to a phase delayed by a coarse phase from the reference clock signal.

In operation S113, the clock generator 150 may generate a test clock signal for a predetermined period. For example, the clock generator 150 may generate a test clock signal during a plurality of data transmission periods to determine an invalid signal generation probability for each test clock signal.

In operation S115, the clock generator 150 may count the number of invalid signals among the N-bit signals generated in synchronization with the test clock signal for a predetermined period.

In operation S117, the clock generator 150 may determine whether the first test for a predetermined number of test clock signals is completed. For example, it may be determined in advance that the clock generator 150 performs a test on a total of five clock signals while changing the phase of the test clock signal by a fine interval. The fine interval is an interval for dividing the coarse interval further finely, and the size of the fine interval may be determined in advance.

In the case in which the first test is not completed (No in operation S117), the clock generator 150 may right-shift the phase of the test clock signal by a fine interval in operation S119. Then, the clock generator 150 may repeat operations S113 to S117 with respect to the test clock signal having the changed phase.

When the first test is completed (YES in operation S117), the clock generator 150 may initialize the phase of the test clock signal to perform the second test, in operation S121. For example, the clock generator 150 may determine the phase of the test clock signal as a phase left-shifted by a fine interval from the coarse phase.

In operation S123, the clock generator 150 may generate a test clock signal for a predetermined period.

In operation S125, the clock generator 150 may count the number of invalid signals among the N-bit signals generated in synchronization with the test clock signal for a predetermined period.

In operation S127, the clock generator 150 may determine whether the second test for a predetermined number of test clock signals is completed. For example, it may be determined in advance that the clock generator 150 performs a test on a total of four clock signals while changing the phase of the test clock signal by a fine interval.

In the case in which the second test is not completed (NO in operation S127), the clock generator 150 may left-shift the phase of the test clock signal by a fine interval in operation S129. Then, the clock generator 150 may repeat operations S123 to S127 with respect to the test clock signal having the changed phase.

When the second test is completed (YES in operation S127), the clock generator 150 may determine an intermediate value of the phases of two test clock signals having the lowest invalid signal count, as a fine phase, in operation S131.

Referring to FIG. 12, a plurality of multilevel signals received by a semiconductor device according to an example embodiment may have four levels LV1-LV4 that do not overlap each other. FIG. 12 illustrates a portion of the data transmission period (PR) with respect to the coarse phase.

The clock generator 150 may perform a test on the test clock signals CK_TEST having various phases centered on the coarse phase during the fine determination operation. The position of the edge of the test clock signal CK_TEST in the case in which the phase of the test clock signal CK_TEST is a coarse phase is illustrated as '0'. The positions of the edges of the test clock signal CK_TEST in the case in which the test clock signal CK_TEST is right-shifted by the fine interval $\Delta F$ from the coarse phase are indicated by '1', '2', '3', and '4', respectively, and the positions of the edges of the test clock signal CK_TEST in the case of being left-shifted are indicated by '−1', '−2', '−3', and '−4', respectively.

The clock generator 150 may determine an intermediate value of the phases of two test clock signals CK_TEST having the smallest number of occurrences of the invalid signal in a predetermined period, as the fine phase. FIG. 12 illustrates the number of times of generation of an invalid signal INV_CNT for each test clock signal CK_TEST. FIG. 12 illustrates a case in which the invalid signal is generated once when the positions of the rising edges of the test clock signal CK_TEST are '−4', '−3', and '−2', and the invalid signal is not generated in the other cases. According to an example embodiment, the clock generator 150 may determine an intermediate value between the highest phase and the lowest phase among the phases having the lowest invalid signal generation probability, as the fine phase. In the example of FIG. 12, an intermediate phase of positions '−1' and '4' may be determined as a fine phase. The clock generator 150 may determine a signal having a phase changed by a fine phase from the reference clock signal CK_REF, as the input clock signal CK_IN.

Figure 13:
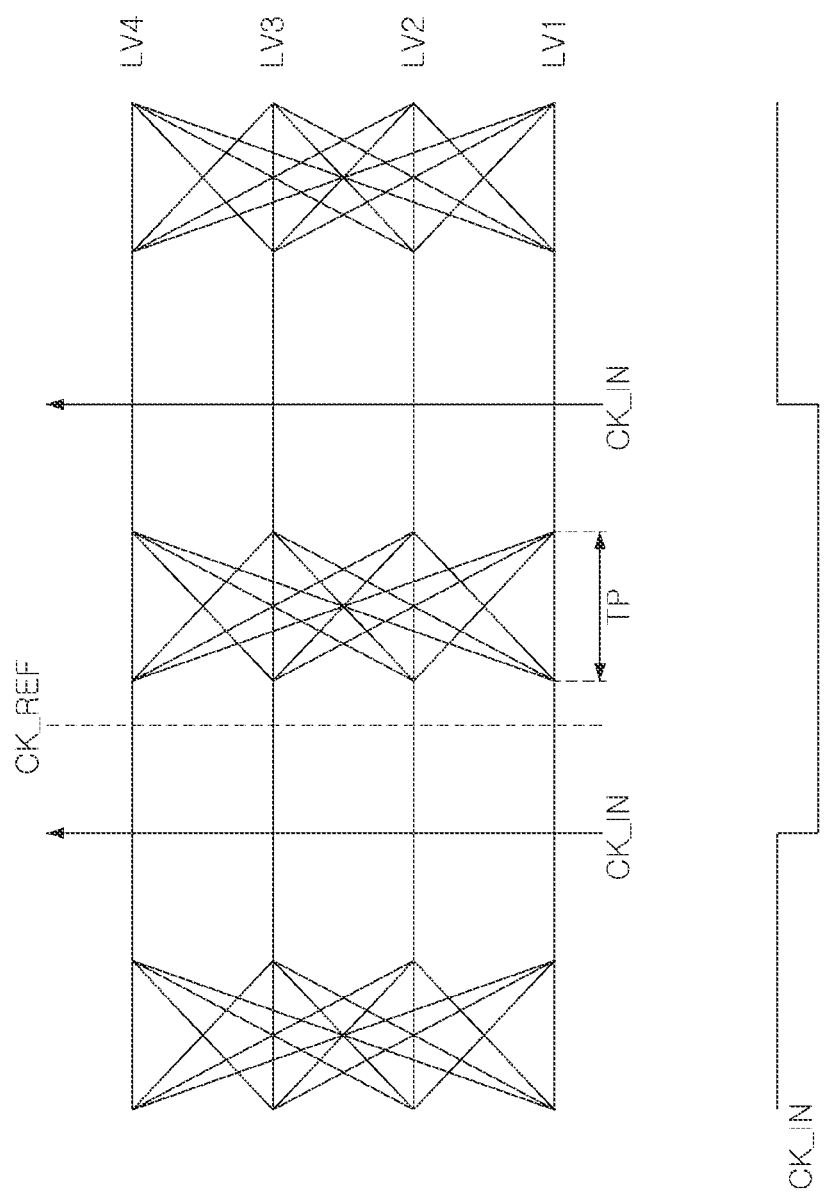
FIG. 13 is a view illustrating an input clock signal determined according to an example embodiment.

FIG. 13 is a view illustrating an input clock signal determined according to an example embodiment.

Referring to FIG. 13, a plurality of multilevel signals received by a semiconductor device according to an example embodiment may have four levels LV1-LV4 that do not overlap each other.

The clock generator 150 may transmit the input clock signal CK_IN obtained by changing the phase of the reference clock signal CK_REF by the fine phase, to the multilevel receiver 130. FIG. 13 illustrates a falling edge and a rising edge of the input clock signal CK_IN. According to an example embodiment, the clock generator 150 sequentially generates test clock signals having various phases, determines the generation probability of the invalid signal according to the phase of the test clock signal, and may determine a phase in which the generation probability of the invalid signal may be minimized, as the phase of the input clock signal CK_IN. Accordingly, the phase of the input clock signal CK_IN may be determined such that the edge of the input clock signal CK_IN avoids the transition period TP, regardless of the phase of the initial reference clock signal CK_REF. In addition, the multilevel receiver 130 is synchronized with the input clock signal CK_IN to generate an N-bit signal and may generate the N-bit signal accurately.

On the other hand, the edge of the input clock signal CK_IN may not be located in the center of the eye pattern of the data. For example, the edge of the input clock signal CK_IN may be at a slightly leading position from the center of the eye pattern. After the value of the input clock signal CK_IN is changed from logic '0' to '1', a slight delay may occur until the signals are sampled by the comparators. According to an example embodiment, the clock generator 150 may determine a phase having the lowest probability of generating an invalid signal among the N-bit signals, as the phase of the input clock signal CK_IN. Accordingly, the input clock signal CK_IN determined according to an example embodiment may not be located at the center of the eye pattern, but the multilevel receiver 130 operating in synchronization with the input clock signal CK_IN may be located on the center of the eye pattern and may sample multilevel signals.

Figure 14:
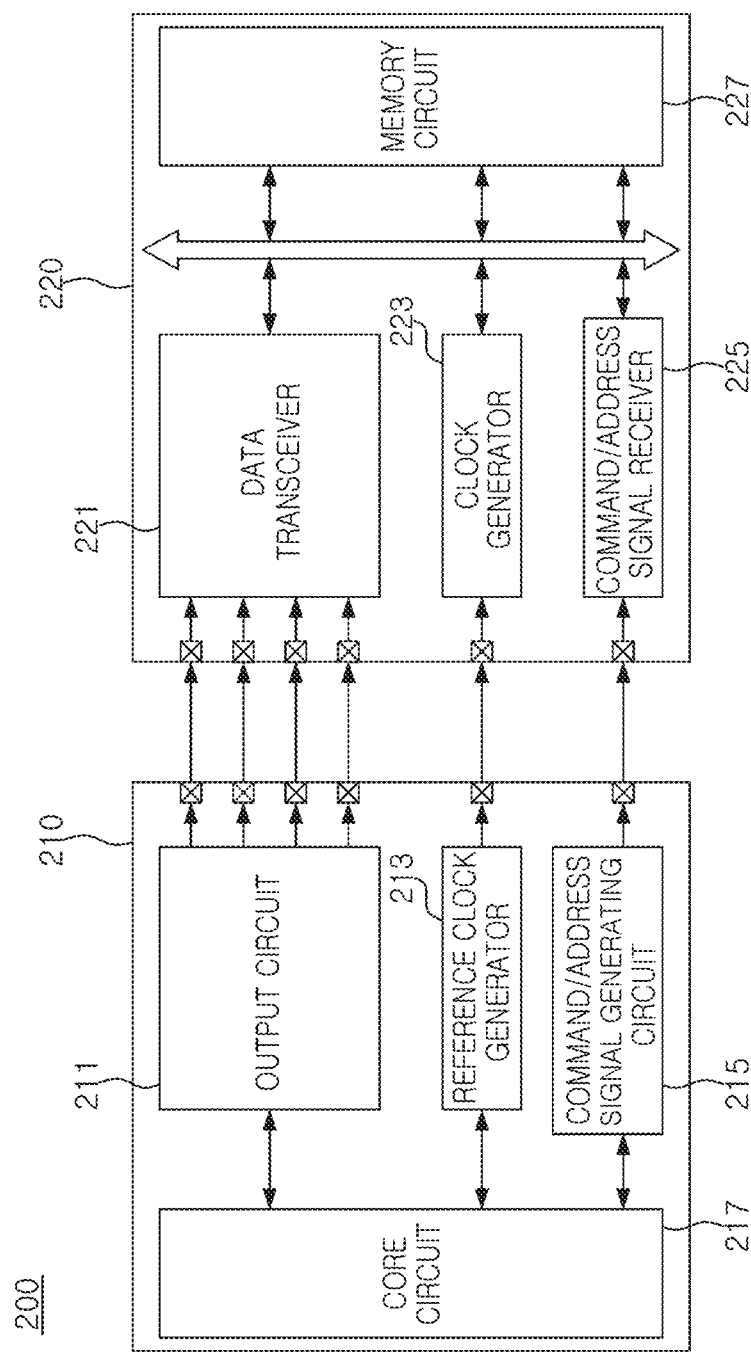
FIG. 14 is a diagram illustrating a memory system according to an example embodiment.

FIG. 14 is a diagram illustrating a memory system according to an example embodiment.

Referring to FIG. 14, a memory system 200 according to an example embodiment may include a controller 210 and a memory device 220 exchanging data.

The controller 210 may transmit a clock signal and a command/address signal required for the operation of the memory device 220 and a data signal to be stored in the memory device 220 to the memory device 220. The memory device 220 may write/delete or read data in response to the control of the controller 210 and may transmit the read data to the controller 210 in the form of a data signal.

The controller 210 may include a data input/output circuit 211 sending and receiving a data signal, a command/address signal generating circuit 215 transmitting a command/address signal to the memory device 220, a reference clock generator 213 transmitting a clock signal to the memory device 220, and a core circuit 217 controlling the overall operation of the controller 210.

The memory device 220 may include a data transceiver 221 inputting and outputting a data signal, a command/address signal receiver 225 receiving a command/address signal, a clock generator 223 receiving a clock signal from an external source and generating a clock signal for internal operation, and a memory circuit 227. The memory circuit 227 may include a bank having memory cells.

At least one of the signals transmitted between the controller 210 and the memory device 220 may be a multilevel signal. For example, a data signal between the controller 210 and the memory device 220 may be converted into a plurality of multilevel signals and transmitted through a plurality of pins.

The data transceiver 221 may generate data by restoring the data signal received from the controller 210. The data restored by the data transceiver 221 may be stored in the memory circuit 227. For example, the data transceiver 221 may be synchronized with the clock signal provided by the clock generator 223 to restore the data signal transmitted by the controller 210 to data. Therefore, if the phase of the clock signal provided by the clock receiver is not accurately determined, an error may occur in the process of restoring data.

When the data signal is transmitted as a plurality of multilevel signals, the data transceiver 221 may restore the data signal according to a result of mutual comparison of the plurality of multilevel signals. For example, the data transceiver 221 may generate a result of mutual comparison of the plurality of multilevel signals as an N-bit signal and may restore the N-bit signal to a corresponding M-bit data signal when the N-bit signal is a valid signal mapped to the M-bit signal.

According to an example embodiment, the clock generator 223 may determine the generation probability of an invalid signal according to the phase of the clock signal, using test clock signals having various phases, and may prevent an error in the data transceiver 221 by determining, as the phase of the input clock signal CK_IN, a phase having a low probability of generating an invalid signal among the N-bit signals.

Figure 15:
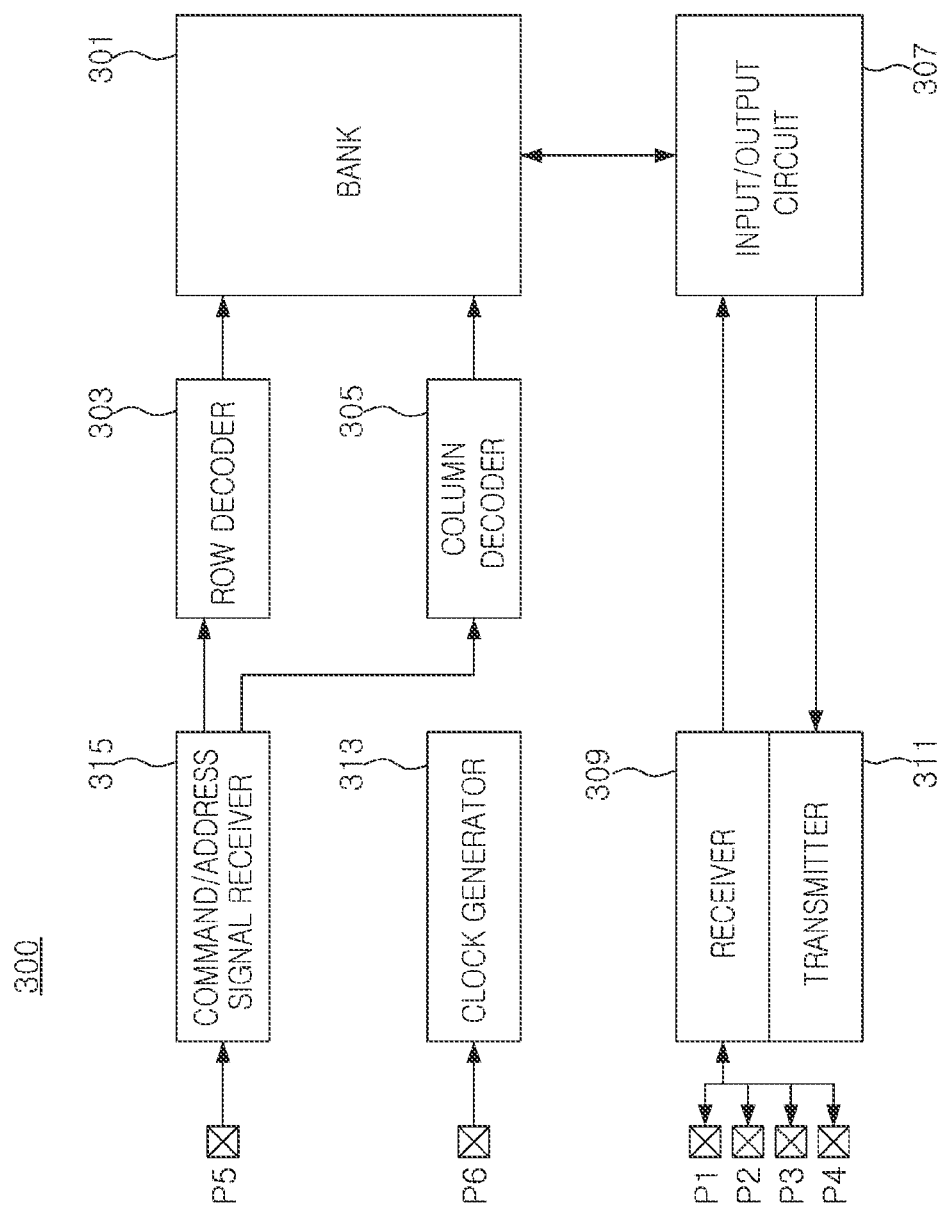
FIG. 15 is a diagram schematically illustrating a semiconductor device included in a memory system according to an example embodiment.

FIG. 15 is a diagram schematically illustrating a semiconductor device included in a memory system according to an example embodiment.

Referring to FIG. 15, a semiconductor device according to an example embodiment may be a memory device 300. The memory device 300 may include a bank 301 having memory cells, a row decoder 303, a column decoder 305, and an input/output circuit 307. The row decoder 303 and the column decoder 305 may select at least one of the memory cells included in the bank 301, and the input/output circuit 307 may write data to the selected memory cells or may read data stored in the selected memory cells.

Also, the memory device 300 may further include a plurality of circuits connected to a plurality of pins P1-P6. For example, a receiver 309 and a transmitter 311 may be connected to data pins P1-P4, the receiver 309 may receive a data signal from an external controller, and the transmitter 311 may transmit a data signal to the external controller. A clock generator 313 may be connected to a clock pin P6. The clock generator 313 may generate a clock signal required for the operation of the memory device 300 using the reference clock received from the external controller. A command/address signal receiver 315 may be connected to a command/address pin P5.

At least one of the signals received by the plurality of pins P1-P6 from the external controller may be a multilevel signal. For example, data signals transmitted and received through the data pins P1-P4 may be multilevel signals. The receiver 309 may be synchronized with the clock signal provided by the clock generator 313 and may restore data received as a plurality of multilevel signals. For example, the receiver 309 may restore data by comparing a plurality of multilevel signals for each rising edge and falling edge of the clock signal.

Figure 16:
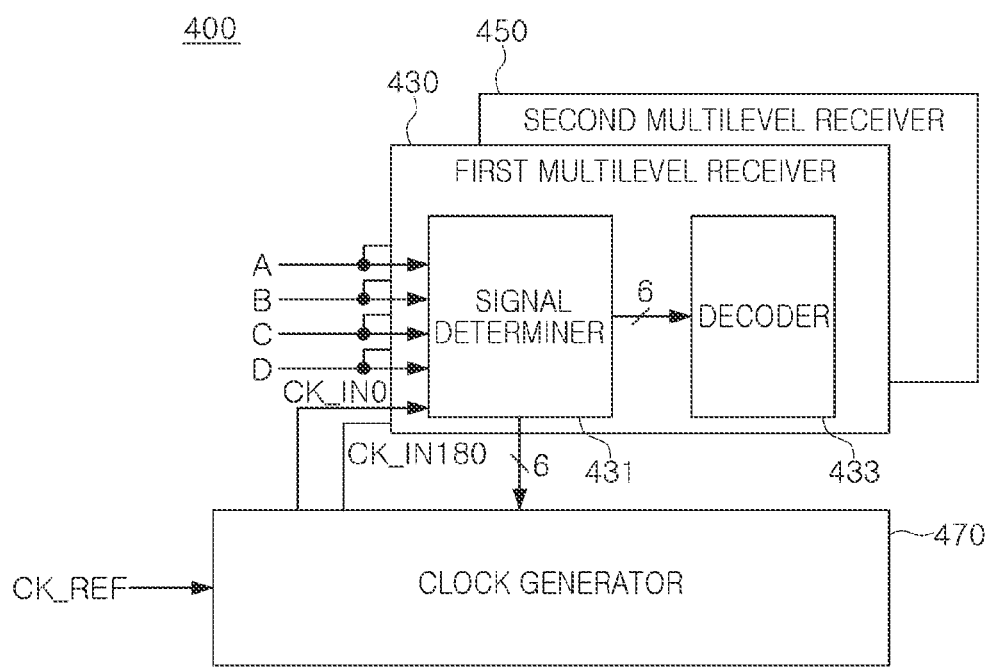
FIG. 16 is a diagram schematically illustrating a semiconductor device according to an example embodiment.

FIG. 16 is a diagram schematically illustrating a semiconductor device according to an example embodiment.

A semiconductor device 400 according to an example embodiment may include a first multilevel receiver 430, a second multilevel receiver 450, and a clock generator 470.

The first multilevel receiver 430 may include a signal determiner 431 that receives a plurality of multilevel signals A-D and compares the levels of the plurality of received multilevel signals A-D with each other to generate an N-bit signal and a decoder 433 that restores the N-bit signal to an M-bit data signal. Similar to the first multilevel receiver 430, the second multilevel receiver 450 may also include a signal determiner that receives a plurality of multilevel signals A-D and compares the levels of the plurality of received multilevel signals A-D to generate an N-bit signal and a decoder that restores the N-bit signal to an M-bit data signal.

The clock generator 470 may receive a reference clock signal CK_REF. The clock generator 470 may generate an input clock signal CK_IN by using the reference clock signal CK_REF. According to an example embodiment, the input clock signal CK_IN may be a half-rate clock signal having a frequency of half the frequency of the multilevel signals A-D. The clock generator 470 may transmit the input clock signal CK_IN0 to the first multilevel receiver 430 and may transmit an inverted input clock signal CK_IN180 obtained by phase-shifting the input clock signal by 180 degrees, to the second multilevel receiver 450. The first multilevel receiver 430 may be synchronized with the input clock signal CK_IN0 to generate an N-bit signal, and the second multilevel receiver 450 may be synchronized with the inverted input clock signal CK_IN180 to generate an N-bit signal.

Figure 17:
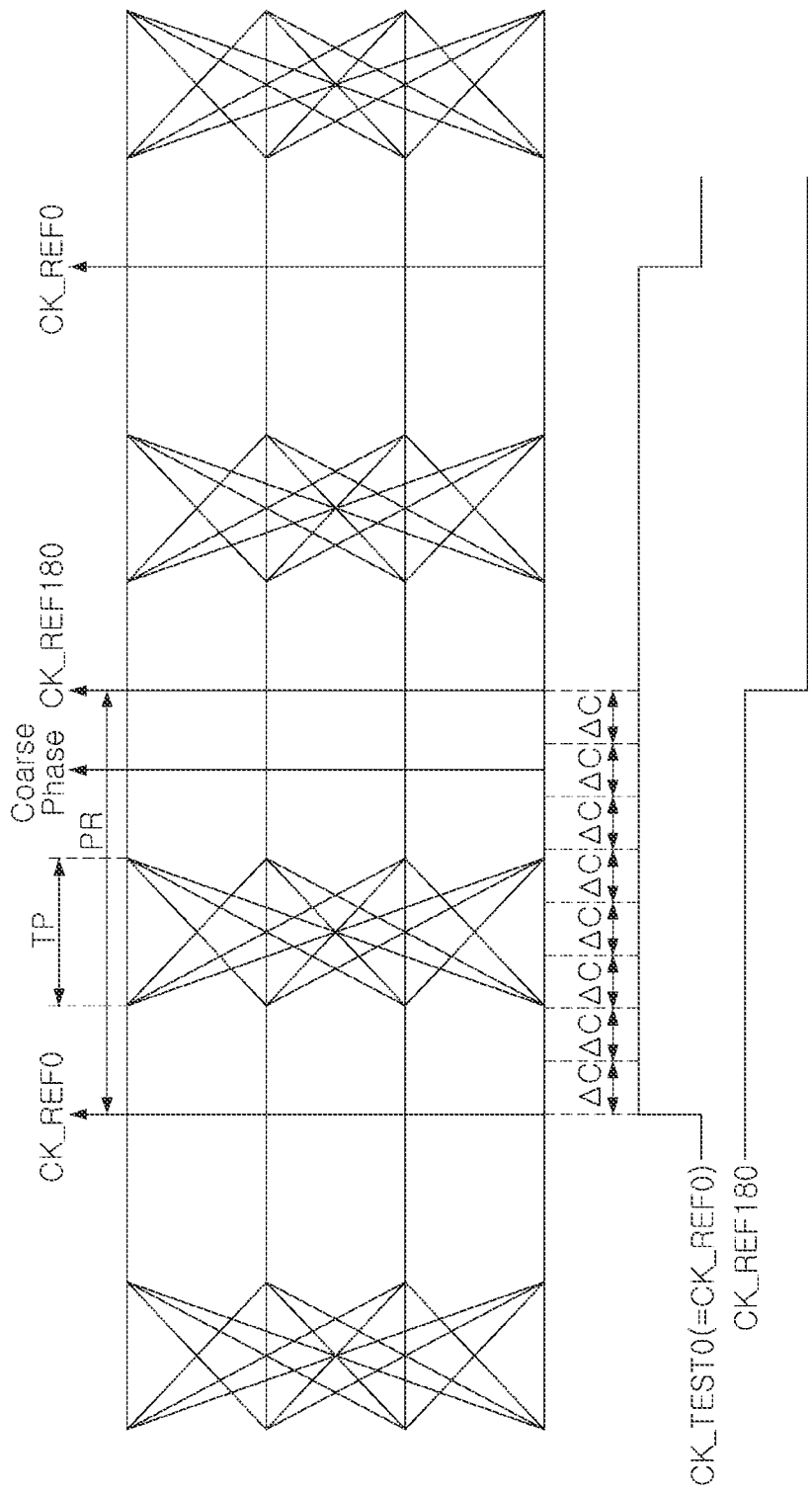
FIG. 17 is a diagram illustrating an operation of a semiconductor device according to an example embodiment.

FIG. 17 is a diagram illustrating an operation of a semiconductor device according to an example embodiment.

Referring to FIG. 17, according to an example embodiment, a plurality of multilevel signals received by a semiconductor device may have four levels LV1-LV4 that do not overlap each other. The plurality of multilevel signals may be generated based on a multi-pin multilevel signaling method, for example, a 4 bit-4 wire-4 level signaling method. The semiconductor device may receive 4-bit data during one data transmission period PR by the plurality of multilevel signals generated based on the 4 bit-4 wire-4 level signaling method.

The plurality of multilevel signals may be sampled at rising edges and falling edges of the input clock signal CK_IN0 and the inverted input clock signal CK_IN180. In FIG. 17, the positions of the edge of a reference clock signal CK_REF0 and the edge of an inverted reference clock signal CK_REF180 are illustrated. The interval between the edge of the reference clock signal CK_REF0 and the edge of the inverted reference clock signal CK_REF180 may be the same as a data transmission period PR.

According to an example embodiment, the clock generator 470 may sequentially generate test clock signals having various phases, provide the test clock signal to the first multilevel receiver 430, and provide an inverted test clock signal obtained by phase-shifting the test clock signal by 180 degrees to the second multilevel receiver 450. The first multilevel receiver 430, the second multilevel receiver 450, and the clock generator 470 may correspond to those described with reference to FIG. 16.

A test may be performed on test clock signals having various phases within one data transmission period PR. For example, the data transmission period PR may be divided into eight coarse intervals ΔC. A plurality of test clock signals in which the phase of the reference clock signal CK_REF is shifted by the coarse interval ΔC may be generated.

The clock generator 470 may obtain N-bit signals that are generated in synchronization with the inverted test clock signal and the N-bit signals generated in synchronization with the test clock signal and may count the number of invalid signals among the N-bit signals. The clock generator 470 may determine, as the phase of the input clock signal CK_IN0, a phase in which the probability of generating the invalid signal may be minimized, based on the count result of the invalid signals with respect to the test clock signals having various phases.

Figure 18:
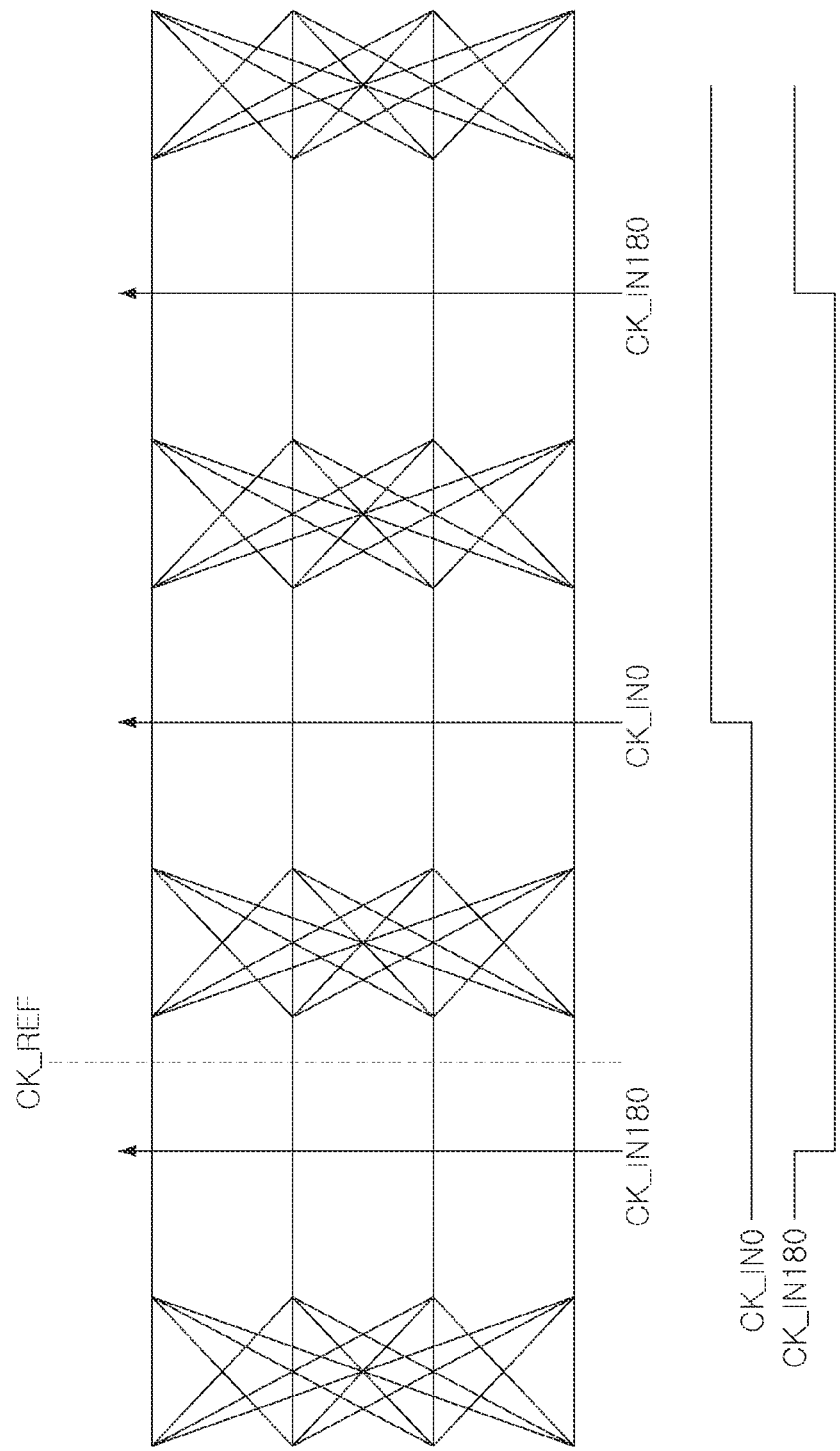
FIG. 18 is a view illustrating an input clock signal determined according to an example embodiment.

FIG. 18 is a view illustrating an input clock signal determined according to an example embodiment.

Referring to FIG. 18, according to an example embodiment, a plurality of multilevel signals received by a semiconductor device may have four levels LV1-LV4 that do not overlap each other.

The clock generator 470 provides the input clock signal CK_IN0 determined according to an example embodiment to the first multilevel receiver 430 and may provide an inverted input clock signal CK_IN180 obtained by shifting the phase of the input clock signal CK_IN0 by 180 degrees to the second multilevel receiver 450. FIG. 18 illustrates edges of the input clock signal CK_IN0 and the inverted input clock signal CK_IN180. According to an example embodiment, a phase in which the probability of generating an invalid signal may be minimized may be determined as the phase of the input clock signal CK_IN0. Accordingly, the edges of the input clock signal CK_IN0 and the inverted input clock signal CK_IN180 may avoid a transition period TP, and the first and second multilevel receivers 430 and 450 may accurately generate the N-bit signal.

Figure 19:
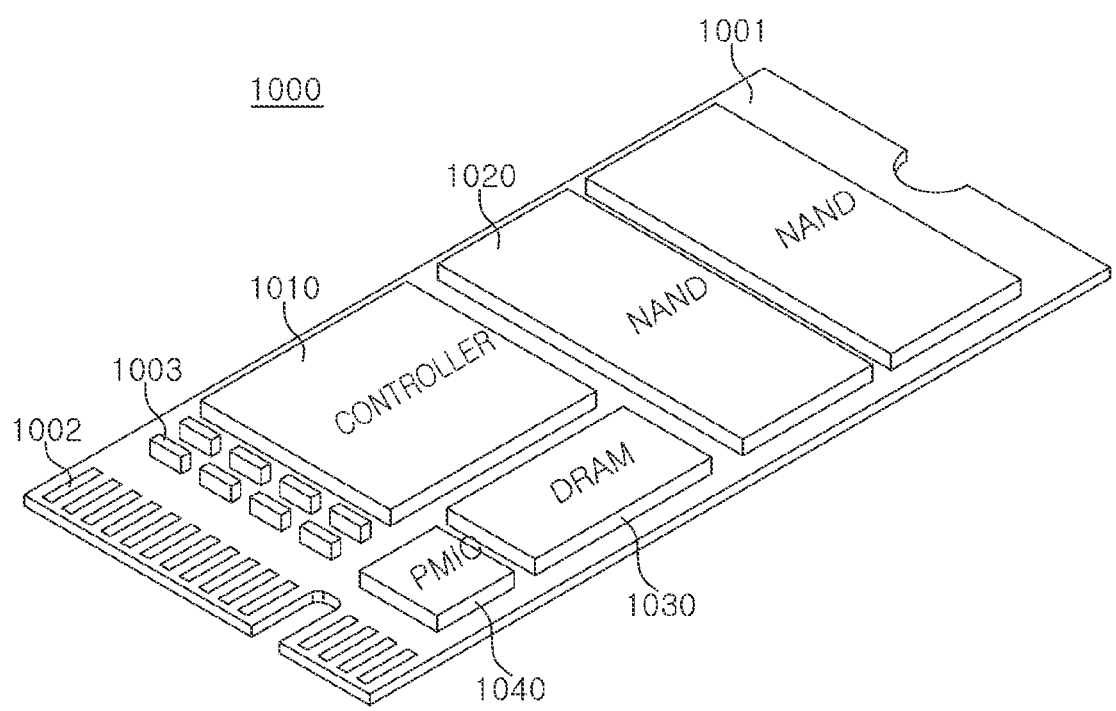
FIG. 19 is a diagram schematically illustrating a memory system according to an example embodiment.

FIG. 19 is a diagram schematically illustrating a memory system according to an example embodiment.

A memory system 1000 according to an example embodiment illustrated in FIG. 19 may be a solid state drive (SSD). The memory system 1000 may have a form factor according to the M.2 standard and may communicate with an external central processing unit, a system-on-chip, an application processor, or the like according to a Peripheral Component Interconnect Express (PCIe) protocol.

The memory system 1000 may include a system board 1001, connector pins 1002 and component elements 1003 formed on the system board 1001, a controller 1010 mounted on the system board 1001, a NAND memory 1020, a DRAM 1030, a PMIC 1040, and the like. The connector pins 1002 may be in contact with pins of a server device and/or a computer device on which the memory system 1000 is mounted. The component elements 1003 may include passive elements such as resistors and capacitors required for the operation of the memory system 1000.

The controller 1010 may control the memory system 1000 according to a control command from a computer device and/or a server device. The controller 1010 may store the data received through the connector pins 1002 in the NAND memory 1020 and/or the DRAM 1030 or read the data stored in the NAND memory 1020 and/or the DRAM 1030 and may output the data to the computer device and/or the server device. The PMIC 1040 may distribute power received through the connector pins 1002 to the controller 1010, the NAND memory 1020, and the DRAM 1030.

The controller 1010 may be connected to the NAND memory 1020 and the DRAM 1030 through wirings formed on the system board 1001. For example, the controller 1010 may generate a data signal, using a pulse amplitude modulation method, and may transmit the data signal to the NAND memory 1020 and/or the DRAM 1030. The multi-level receiver of the NAND memory 1020 and/or the DRAM 1030 receiving a data signal of the pulse amplitude modulation or the like may operate in synchronization with a clock signal received from the controller 1010. As described above with reference to FIGS. 1 to 18, the NAND memory 1020 and/or the DRAM 1030 may include a clock generator that adjusts the phase of an input clock signal input to the multilevel receiver, based on the generation probability of the invalid signal according to the phase of the test clock signal.

Figure 20:
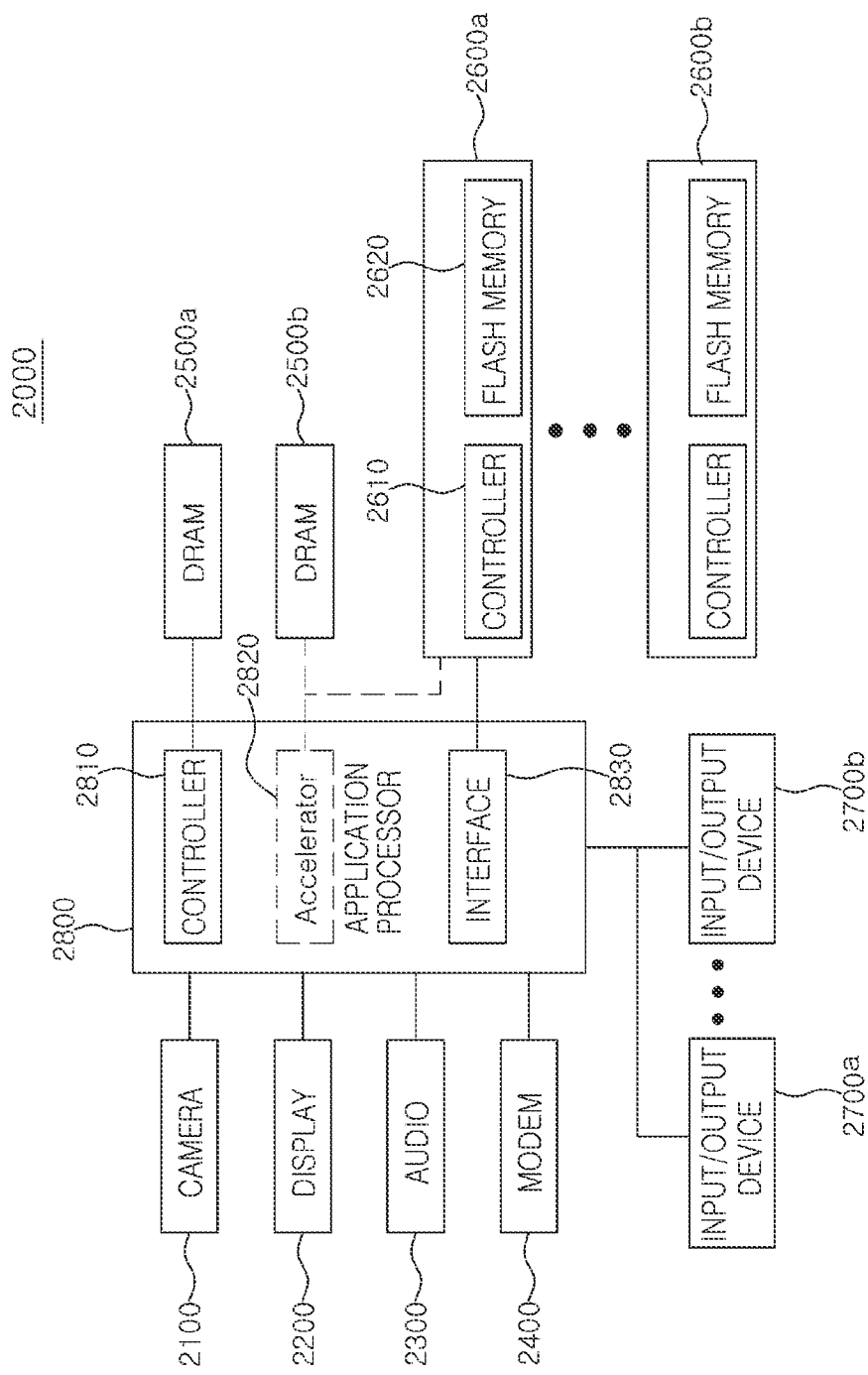
FIG. 20 is a diagram schematically illustrating a mobile system including a semiconductor device according to an example embodiment.

FIG. 20 is a diagram schematically illustrating a mobile system including a semiconductor device according to an example embodiment.

Referring to FIG. 20, a mobile system 2000 may include a camera 2100, a display 2200, an audio processing unit 2300, a modem 2400, DRAMs 2500*a* and 2500*b*, flash memory devices 2600*a* and 2600*b*, input/output devices 2700*a* and 2700*b*, and an application processor (hereinafter, "AP") 2800.

The mobile system 2000 may be implemented as a laptop computer, a portable terminal, a smart phone, a tablet PC, a wearable device, a healthcare device, or an Internet-of-Things (IoT) device. Also, the mobile system 2000 may be implemented as a server or a personal computer.

The camera 2100 may capture a still image or a moving image according to a user's control. The mobile system 2000 may acquire specific information using a still image/video captured by the camera 2100 or convert the still image/video into other types of data such as text and store the data. Alternatively, the mobile system 2000 may recognize a character string included in the still image/video captured by the camera 2100 and provide a text or audio translation corresponding to the character string. As such, the field of application of the camera 2100 in the mobile system 2000 tends to be diversified. In an example embodiment, the camera 2100 may transmit data such as a still image/video to the AP 2800 according to the D-Phy or C-Phy interface according to the MIPI standard.

The display 2200 may be implemented in various forms, such as a liquid crystal display (LCD), an organic light emitting diode (OLED) display, an active-matrix organic light-emitting diode (AM-OLED), a plasma display panel (PDP), a field emission display (FED), electronic paper, and the like. In an example embodiment, the display 2200 may also be used as an input device of the mobile system 2000 by providing a touch screen function. Also, the display 2200 may be provided integrally with a fingerprint sensor and the like to provide a security function of the mobile system 2000. In an example embodiment, the AP 2800 may transmit image data to be displayed on the display 2200 to the display 2200 according to the D-Phy or C-Phy interface according to the MIPI standard.

The audio processing unit 2300 may process audio data stored in the flash memory devices 2600*a* and 2600*b* or audio data included in content received externally through the modem 2400 or the input/output devices 2700*a* and 2700*b*. For example, the audio processing unit 2300 may perform various processes such as coding/decoding, amplification, and noise filtering on audio data.

The modem 2400 may modulate and transmit a signal to transmit/receive wired/wireless data and may demodulate a signal received from an external source to restore an original signal. The input/output devices 2700*a* and 2700*b* are devices that provide digital input/output and may include a port that may be connected to an external recording medium, an input device such as a touch screen or mechanical button key, an output device capable of outputting vibrations in a haptic manner or the like, and the like. In some examples, the input/output devices 2700*a* and 2700*b* may be connected to an external recording medium through a port such as a USB, a lightning cable, an SD card, a micro SD card, a DVD, a network adapter, or the like.

The AP 2800 may control the overall operation of the mobile system 2000. In detail, the AP 2800 may control the display 2200 such that a part of the content stored in the flash memory devices 2600*a* and 2600*b* is displayed on the screen. Also, when a user input is received through the input/output devices 2700*a* and 2700*b*, the AP 2800 may perform a control operation corresponding to the user input.

The AP 2800 may be provided as a system-on-chip (SoC) that drives an application program, an operating system (OS), and the like. Also, the AP 2800 may be included in a single semiconductor package together with other devices included in the mobile system 2000, for example, the DRAM 2500*a*, the flash memory 2620, and/or the memory controller 2610. For example, the AP 2800 and at least one other device may be provided in the form of a package, such as Package on Package (PoP), Ball grid arrays (BGAs), Chip scale packages (CSPs), System In Package (SIP), Multi Chip Package (MCP), Wafer-level Fabricated Package (WFP), Wafer-Level Processed Stack Package (WSP), or the like. A kernel of an operating system driven on the AP 2800 may include an input/output scheduler and a device driver for controlling the flash memory devices 2600*a* and 2600*b*. The device driver may control the access performance of the flash memory devices 2600*a* and 2600*b* by referring to the number of synchronization queues managed by the input/output scheduler or control the CPU mode inside of the SoC, the Dynamic Voltage and Frequency Scaling (DVFS) level, and the like.

In an example embodiment, the AP 2800 may include a processor block that executes an operation or drives an application program and/or an operating system and various other peripheral components connected to the processor block through a system bus. Peripheral components may include a memory controller, an internal memory, a power management block, an error detection block, a monitoring block, and the like. The processor block may include one or more cores, and when a plurality of cores are included in the processor block, each of the cores may include a cache memory and a common cache shared by the cores may be included in the processor block.

In an example embodiment, the AP 2800 may include an accelerator block 2820 that is a dedicated circuit for AI data operation. Alternatively, according to example embodiments, a separate accelerator chip may be provided separately from the AP 2800 and the DRAM 2500b may be additionally connected to the accelerator block 2820 or the accelerator chip. The accelerator block 2820 is a function block that performs a specific function of the AP 2800 and may include a Graphics Processing Unit (GPU) that is a functional block specializing in processing graphic data, a Neural Processing Unit (NPU) that is a block for performing AI calculations and inference, a Data Processing Unit (DPU) that is a block that specializes in data transmission, and the like.

According to an example embodiment, the mobile system 2000 may include a plurality of DRAMs 2500a and 2500b. In an example embodiment, the AP 2800 may include a controller 2810 for controlling the DRAMs 2500a and 2500b and the DRAM 2500a may be directly connected to the AP 2800.

The AP 2800 may control the DRAM by setting a command and a mode register set (MRS) conforming to the JEDEC standard or may communicate by setting specifications and functions required by the mobile system 2000, such as low voltage/high speed/reliability and the DRAM interface protocol for CRC/ECC. For example, the AP 2800 may communicate with the DRAM 2500a through an interface conforming to the JEDEC standards such as LPDDR4, LPDDR5 and the like. Alternatively, the AP 2800 may also communicate by setting a new DRAM interface protocol in order for an accelerator chip provided separately from the accelerator block 2820 or the AP 2800 to control the DRAM 2500b for an accelerator having a higher bandwidth than the DRAM 2500a.

Although only the DRAMs 2500a and 2500b are illustrated in FIG. 20, the configuration of the mobile system 2000 is not necessarily limited to such a form, and depending on the bandwidth, reaction speed, and voltage conditions of the AP 2800 or the accelerator block 2820, memory other than the DRAMs 2500a and 2500b may be included in the mobile system 2000. For example, the controller 2810 and/or the accelerator block 2820 may control various memories such as PRAM, SRAM, MRAM, RRAM, FRAM, and Hybrid RAM. The DRAMs 2500a and 2500b have relatively lower latency and higher bandwidth than the input/output devices 2700a and 2700b or the flash memory devices 2600a and 2600b. The DRAMs 2500a and 2500b may be initialized when the mobile system 2000 is powered on. When the operating system and application data are loaded, the DRAMs 2500a and 2500b may be used as temporary storage locations for the operating system and application data or as execution spaces for various software codes.

In the DRAMs 2500a and 2500b, addition/subtraction/multiplication/division arithmetic operations, vector operations, address operations, or FFT operation data may be stored. In another embodiment, the DRAMs 2500a and 2500b may be provided as a processing in memory (PIM) equipped with an arithmetic function. For example, a function for execution, used for inference, may be performed in the DRAMs 2500a and 2500b. In this case, the inference may be performed in a deep learning algorithm using an artificial neural network. The deep learning algorithm may include a training operation of learning a model through various data and an inference operation of recognizing data with the learned model. For example, the function used for inference may include a hyperbolic tangent function, a sigmoid function, a Rectified Linear Unit (ReLU) function, and the like.

As an example embodiment, the image captured by the user through the camera 2100 may be signal-processed and stored in the DRAM 2500b and the accelerator block 2820 or the accelerator chip may perform an AI data operation of recognizing data by using the data stored in the DRAM 2500b and the function used for inference.

According to an example embodiment, the mobile system 2000 may include a plurality of flash memory devices 2600a and 2600b or a plurality of storage devices having a capacity greater than that of the DRAMs 2500a and 2500b. The flash memory devices 2600a and 2600b may include a controller 2610 and a flash memory 2620. The controller 2610 may receive a control command and data from the AP 2800, write data to the flash memory 2620 in response to the control command, or read data stored in the flash memory 2620 and transmit the read data to the AP 2800.

According to an example embodiment, the accelerator block 2820 or the accelerator chip may perform a training operation and AI data operation by using the flash memory devices 2600a and 2600b. In an example embodiment, arithmetic logic capable of executing a predetermined operation may be implemented in the controller 2610 in the flash memory devices 2600a and 2600b and the arithmetic logic may also execute instead at least a portion of the training operation and the inference AI data operation performed by the AP 2800 and/or the accelerator block 2820 using data stored in the flash memory 2620.

In an example embodiment, the AP 2800 may include an interface 2830, and thus, the flash memory devices 2600a and 2600b may be directly connected to the AP 2800. For example, the AP 2800 may be implemented as an SoC, the flash memory device 2600a may be implemented as a separate chip different from the AP 2800, and the AP 2800 and the flash memory device 2600a may be mounted in one package. However, example embodiments of the present disclosure are not limited thereto and the plurality of flash memory devices 2600a and 2600b may be electrically connected to the mobile system 2000 through a connection.

The flash memory devices 2600a and 2600b may store data such as still images/videos captured by the camera 2100 or data received through a communication network and/or ports included in the input/output devices 2700a and 2700b. For example, augmented reality/virtual reality, High Definition (HD), or Ultra High Definition (UHD) contents may be stored.

At least some devices, among the camera 2100, the display 2200, the audio processing unit 2300, the modem 2400, the DRAMs 2500a and 2500b, the flash memory devices 2600a and 2600b, the input/output devices 2700a and 2700b, and the AP 2800, included in the mobile system 2000, described with reference to FIG. 20, may exchange multilevel signals with each other. For example, the AP 2800 may exchange data with at least one of other components through a plurality of multilevel signals. Devices exchanging data through a plurality of multilevel signals may optimize operation timing of a multilevel receiver receiving a plurality of multilevel signals, using at least one of the example embodiments described above with reference to FIGS. 1 to 18.

As set forth above, according to example embodiments, since the phase of the clock signal provided to the receiver may be adjusted using a signal generated in the process of restoring the data signal in the receiver, power consumption of the semiconductor device may be reduced.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While example embodiments have been illustrated and described above, it will be apparent to those skilled in the art that modifications and variations could be made without departing from the scope of the present disclosure as defined by the appended claims.

What is claimed is:

1. A semiconductor device comprising:
a multilevel receiver including a signal determiner configured to receive a plurality of multilevel signals and to output a result of mutual comparison of the plurality of multilevel signals as an N-bit signal, where N is a natural number equal to or greater than 2, and a decoder configured to restore a valid M-bit data signal among a plurality of N-bit signals from the signal determiner, where M is a natural number less than N; and
a clock generator configured to receive a reference clock signal, to generate an input clock signal using the reference clock signal, to input inputting the input clock signal to the signal determiner, and to determine a phase of the input clock signal based on a number of occurrences of an invalid signal not mapped to the valid M-bit data signal among the N-bit signals during a test for a plurality of test clock signals.

2. The semiconductor device of claim 1, wherein the clock generator is further configured to sequentially generate test clock signals having various phases and determines a number of occurrences of an invalid signal according to a phase of a test clock signal based on N-bit signals output in synchronization with the test clock signals.

3. The semiconductor device of claim 1, wherein the clock generator:
completes the test for the plurality of test clock signals by repeating operations of generating a test clock signal for a predetermined period, counting the number of occurrences of an invalid signal among N-bit signals output from the signal determiner during the predetermined period, and changing a phase of the test clock signal by a coarse interval a predetermined number of times; and
determines, as a coarse phase, an intermediate value of phases of two test clock signals having a lowest invalid signal count among the plurality of test clock signals.

4. The semiconductor device of claim 3, wherein the coarse interval is an interval that divides a data transmission period of the plurality of multilevel signals into a plurality of equal time intervals.

5. The semiconductor device of claim 3, wherein the clock generator determines, as the coarse phase, an intermediate value between a highest phase and a lowest phase among phases of three or more test clock signals, when test clock signals having a lowest invalid signal count are the three or more test clock signals among the plurality of test clock signals.

6. The semiconductor device of claim 3, wherein the clock generator:
initializes the phase of the test clock signal using the coarse phase and completes a first test by right-shifting the phase of the test clock signal by a fine interval;
initializes the phase of the test clock signal using the coarse phase and completes a second test by left-shifting the phase of the test clock signal by a fine interval; and
determines, as a fine phase, an intermediate value of phases of two test clock signals having a lowest invalid signal count among a plurality of test clock signals tested in the first and second tests.

7. The semiconductor device of claim 1, wherein when an N-bit signal from the signal determiner corresponds to any one of predetermined $2^M$ signal patterns, the decoder restores the N-bit signal to a corresponding M-bit data signal.

8. The semiconductor device of claim 7, wherein the clock generator receives the N-bit signal from the signal determiner, outputs an error signal when the N-bit signal does not correspond to any one of the predetermined $2^M$ signal patterns, and determines a number of occurrences of an invalid signal from among the N-bit signals according to a count result of the error signal.

9. The semiconductor device of claim 1, wherein the signal determiner comprises N comparators, respectively synchronized with the input clock signal, comparing levels of two different signals among the plurality of multilevel signals and outputting a comparison result.

10. A semiconductor device comprising:
a first multilevel receiver and a second multilevel receiver configured to receive a plurality of multilevel signals and to restore a valid signal mapped to a data signal among mutual comparison result signals of the plurality of multilevel signals to the data signal; and
a clock generator configured to receive a reference clock signal, to generate an input clock signal and an inverted input clock signal using the reference clock signal, to input the input clock signal to the first multilevel receiver, to input the inverted input clock signal to the second multilevel receiver, and to determine a phase of the input clock signal based on a number of occurrences of an invalid signal not mapped to a data signal among the mutual comparison result signals during a test for a plurality of test clock signals.

11. The semiconductor device of claim 10, wherein the clock generator is further configured to sequentially generate test clock signals having various phases and determine the number of occurrences of the invalid signal according to a phase of a test clock signal, based on: (1) first mutual comparison result signals output from the first multilevel receiver in synchronization with the test clock signals and (2) second mutual comparison result signals output from the second multilevel receiver in synchronization with inverted signals of the test clock signals.

12. The semiconductor device of claim 10, wherein the clock generator is further configured to:
complete the test for the plurality of test clock signals by repeating operations of generating a test clock signal for a predetermined period, counting the number of occurrences of the invalid signal among the mutual comparison result signals output from the first and second multilevel receivers during the predetermined period, and changing a phase of the test clock signal by a coarse interval a predetermined number of times, and
determines, as a coarse phase, an intermediate value of phases of two test clock signals having a lowest invalid signal count among the plurality of test clock signals.

13. The semiconductor device of claim 12, wherein the coarse interval is an interval dividing a data transmission period of the plurality of multilevel signals into a plurality of equal time intervals.

14. The semiconductor device of claim 13, wherein a frequency of the reference clock signal is half a frequency of the plurality of multilevel signals.

15. A memory system comprising:
a memory device including a plurality of memory cells; and
a controller connected to the memory device through a plurality of data pins and a clock pin and controlling the memory device, wherein:
the controller configured to convert a data signal into a plurality of multilevel signals, to provide the plurality of multilevel signals to the memory device through the plurality of data pins, and to provide a reference clock signal to the memory device through the clock pin, and
the memory device configured to receive the plurality of multilevel signals, to be synchronized with an input clock signal generated using the reference clock signal, to output mutual comparison result signals of the plurality of multilevel signals, and to determine a phase of the input clock signal based on a number of occurrences of an invalid signal not mapped to a data signal among the mutual comparison result signals.

16. The memory system of claim 15, wherein the controller is further configured to convert an M-bit data signal into a plurality of multilevel signals having levels that do not overlap each other within one data transmission period, to transmit the M-bit data signal in the one data transmission period, where M is a natural number equal to or greater than 2.

17. The memory system of claim 16, wherein the number of levels that a plurality of multilevel signals have within the data transmission period is more than $2^M$.

18. The memory system of claim 16, wherein the memory device is further configured to output the mutual comparison result signals of the plurality of multilevel signals as an N-bit signal, where N is a natural number greater than M, and to restore the N-bit signal to a corresponding M-bit data signal when the N-bit signal is a valid signal mapped to the M-bit data signal.

19. The memory system of claim 15, wherein the memory device is further configured to determine the number of occurrences of an invalid signal according to a phase of a test clock signal, based on the mutual comparison result signals output in synchronization with test clock signals having various phases.

20. The memory system of claim 19, wherein the memory device is further configured to determine a phase of an input clock signal based on an intermediate value of phases of two test clock signals having a lowest probability of generating the invalid signal among the test clock signals.

* * * * *